United States Patent
Heo et al.

(10) Patent No.: US 10,680,066 B2
(45) Date of Patent: Jun. 9, 2020

(54) GRAPHENE DEVICE, METHODS OF MANUFACTURING AND OPERATING THE SAME, AND ELECTRONIC APPARATUS INCLUDING THE GRAPHENE DEVICE

(71) Applicant: Samsung Electronics Co., Ltd., Suwon-si, Gyeonggi-do (KR)

(72) Inventors: Jinseong Heo, Seoul (KR); Kiyoung Lee, Seoul (KR); Seongjun Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 131 days.

(21) Appl. No.: 14/635,576

(22) Filed: Mar. 2, 2015

(65) Prior Publication Data
US 2016/0020280 A1     Jan. 21, 2016

(30) Foreign Application Priority Data
Jul. 18, 2014   (KR) ........................ 10-2014-0091314

(51) Int. Cl.
*H01L 29/16* (2006.01)
*H01L 29/778* (2006.01)
(Continued)

(52) U.S. Cl.
CPC ...... *H01L 29/1606* (2013.01); *H01L 29/0895* (2013.01); *H01L 29/24* (2013.01);
(Continued)

(58) Field of Classification Search
CPC ........... H01L 29/1606; H01L 29/66045; H01L 31/028; H01L 33/34; H01L 45/04;
(Continued)

(56) References Cited

U.S. PATENT DOCUMENTS

| 6,621,145 B2 | 9/2003 | Murota et al. |
| 7,327,000 B2 | 2/2008 | DeHeer et al. |

(Continued)

FOREIGN PATENT DOCUMENTS

| JP | H03222373 A | 10/1991 |
| JP | H09232526 A | 9/1997 |

(Continued)

OTHER PUBLICATIONS

U.S. Appl. No. 13/906,657, filed Apr. 10, 2014, Samsung Electronics Co., Ltd.

(Continued)

*Primary Examiner* — Monica D Harrison
*Assistant Examiner* — John Lin
(74) *Attorney, Agent, or Firm* — Harness, Dickey & Pierce, P.L.C.

(57) ABSTRACT

Example embodiments relate to a graphene device, methods of manufacturing and operating the same, and an electronic apparatus including the graphene device. The graphene device is a multifunctional device. The graphene device may include a graphene layer and a functional material layer. The graphene device may have a function of at least one of a memory device, a piezoelectric device, and an optoelectronic device within the structure of a switching device/electronic device. The functional material layer may include at least one of a resistance change material, a phase change material, a ferroelectric material, a multiferroic material, multistable molecules, a piezoelectric material, a light emission material, and a photoactive material.

28 Claims, 32 Drawing Sheets

(51) Int. Cl.
| | |
|---|---|
| *H01L 33/26* | (2010.01) |
| *H01L 29/267* | (2006.01) |
| *H01L 29/08* | (2006.01) |
| *H01L 29/66* | (2006.01) |
| *H01L 29/786* | (2006.01) |
| *H01L 29/24* | (2006.01) |
| *H01L 45/00* | (2006.01) |
| *H01L 31/028* | (2006.01) |
| *H01L 31/113* | (2006.01) |
| *H01L 29/417* | (2006.01) |
| *H01L 33/04* | (2010.01) |
| *H01L 33/34* | (2010.01) |

(52) U.S. Cl.
CPC ...... *H01L 29/267* (2013.01); *H01L 29/66045* (2013.01); *H01L 29/778* (2013.01); *H01L 29/7869* (2013.01); *H01L 29/78684* (2013.01); *H01L 29/78696* (2013.01); *H01L 31/028* (2013.01); *H01L 31/113* (2013.01); *H01L 33/26* (2013.01); *H01L 45/04* (2013.01); *H01L 29/41725* (2013.01); *H01L 29/41775* (2013.01); *H01L 33/04* (2013.01); *H01L 33/34* (2013.01); *Y02E 10/547* (2013.01)

(58) Field of Classification Search
CPC . H01L 45/122; H01L 45/1226; H01L 45/148; H01L 45/149; H01L 29/78696; H01L 29/66015
See application file for complete search history.

(56) References Cited

U.S. PATENT DOCUMENTS

| | | | |
|---|---|---|---|
| 7,851,783 B2 | 12/2010 | Appenzeller et al. | |
| 8,178,862 B2 | 5/2012 | Colinge | |
| 8,247,806 B2 | 8/2012 | Chae et al. | |
| 8,952,361 B2 | 2/2015 | Rimier et al. | |
| 9,064,777 B2 | 6/2015 | Heo et al. | |
| 9,105,556 B2 | 8/2015 | Heo et al. | |
| 9,276,092 B1* | 3/2016 | Karda | H01L 27/115 |
| 2008/0237564 A1* | 10/2008 | Yoon | H01L 45/06 257/3 |
| 2010/0258787 A1 | 10/2010 | Chae et al. | |
| 2011/0220865 A1 | 9/2011 | Miyata et al. | |
| 2013/0256629 A1* | 10/2013 | Lee | H01L 27/283 257/13 |
| 2014/0158989 A1 | 6/2014 | Byun et al. | |
| 2014/0231752 A1 | 8/2014 | Shin et al. | |
| 2015/0155287 A1 | 6/2015 | Heo et al. | |
| 2015/0340631 A1* | 11/2015 | Rinzler | H01L 27/092 257/40 |
| 2015/0349250 A1* | 12/2015 | Chang | H01L 45/08 257/2 |
| 2015/0364545 A1 | 12/2015 | Heo et al. | |

FOREIGN PATENT DOCUMENTS

| | | |
|---|---|---|
| JP | 2010141046 A | 6/2010 |
| JP | 2013521664 A | 6/2013 |
| KR | 20100111999 A | 10/2010 |
| KR | 1020110005152 | 1/2011 |
| KR | 20120114901 A | 10/2012 |
| KR | 20130053097 A | 5/2013 |
| KR | 1020140045841 A | 4/2014 |
| WO | WO-2012127244 A2 | 9/2012 |
| WO | WO-2014085410 A1 | 6/2014 |

OTHER PUBLICATIONS

Kunook Chung et al., "Transferable GaN Layers Grown on ZnO-Coated Graphene Layers for Optoelectronic Devices", Science 330, 655 (2010), pp. 654-657.

Yushi Hu et al., "Variation of switching mechanism in $TiO_2$ thin film resistive random access memory with Ag and graphene electrodes", Microelectronic Engineering 104 (2013), pp. 42.47.

Hamm, Joachim et al., "Two Two-Dimensional Materials Are Better Than One," Science, vol. 340, 2013, pp. 1298-1299.

Yang, Heejun et al., "Graphene Barristor, a Triode Device with a Gate-Controlled Schottky Barrier," Science, vol. 336, 2012, pp. 1140-1143.

Britnell, L. et al., "Strong Light-Matter Interactions in Heterostructures of Atomically Thin Films," Science, vol. 340, 2013, pp. 1311-1326.

Konstantatos, Gerasimos et al., "Hybrid graphene-quantum dot phototransistors with ultrahigh gain," Nature Nanotechnology Letters, 2012, pp. 1-6.

Japanese Office Action for corresponding Application No. 2015-143930, dated Mar. 11, 2019, English translation thereof.

Japanese Office Action for corresponding Application No. 2015-143930, dated Jul. 12, 2019, English translation thereof.

* cited by examiner

< FRAM >

< PIEZOELECTRIC DEVICE >

<PHOTODETECTOR/PHOTOVOLTAIC DEVICE>

< PHOTODETECTOR/PHOTOVOLTAIC DEVICE >

GRAPHENE DEVICE, METHODS OF MANUFACTURING AND OPERATING THE SAME, AND ELECTRONIC APPARATUS INCLUDING THE GRAPHENE DEVICE

RELATED APPLICATION

This application claims the benefit of priority from Korean Patent Application No. 10-2014-0091314, filed on Jul. 18, 2014, in the Korean Intellectual Property Office, the disclosure of which is incorporated herein in its entirety by reference.

BACKGROUND

1. Field

Example embodiments relate to a graphene device, methods of manufacturing and operating the same, and/or an electronic apparatus including the graphene device.

2. Description of the Related Art

A two-dimensional (2D) material is typically a single-layer or half-layer solid material in which atoms form a desired, or alternatively predetermined or given crystal structure. A well-known example of a 2D material is graphene. Graphene is a single-layer (single atomic layer) structure in which carbon atoms form a hexagonal structure. Graphene may have a charge mobility (e.g., ~$2\times10^5$ cm$^2$/Vs) that is typically at least 100 times or higher than a charge mobility of silicon (Si), a current density (e.g., about $10^8$ A/cm$^2$) that is typically at least 100 times or higher than a current density of copper (Cu), and a very high Fermi velocity (VF). Therefore, the graphene has drawn attention as a next-generation material that may overcome limits of materials in the related art.

For at least the above-described reason, a research into devices to which graphene is applied has been conducted. However, a research into devices to which graphene is applied is limited to a device having a single function. To realize electronic devices having various functions, a plurality of devices having different functions are required, and the devices may be connected to (coupled to) each other. This causes various difficulties in terms of process and design.

SUMMARY

Example embodiments relate to multi-functional graphene devices.

Example embodiments relate to graphene devices capable of performing various functions in a single device by combining a functional material layer having a desired, or alternatively predetermined function with graphene.

Example embodiments relate to graphene devices having characteristics (functions) of at least one of a memory device, a piezoelectric device, and an optoelectronic device in the structure of a switching device/electronic device (e.g., a transistor).

Example embodiments relate to methods of manufacturing the graphene devices.

Example embodiments relate to methods of operating the graphene devices.

Example embodiments relate to electronic apparatuses/electronic circuits/logic devices including the graphene devices.

Additional example embodiments will be set forth in part in the description which follows and, in part, will be apparent from the description, or may be learned by practice of the example embodiments.

According to at least one example embodiment, a graphene device includes a graphene layer, a first electrode electrically connected to a first region of the graphene layer, a second electrode corresponding to a second region of the graphene layer, a functional layer between the graphene layer and the second electrode and having at least one of nonvolatile memory characteristics and piezoelectric characteristics, a gate facing the functional layer with the graphene layer therebetween, and a gate insulation layer between the graphene layer and the gate.

The functional layer may include at least one of resistance change material, a phase change material, a ferroelectric material, a multiferroic material, multistable molecules, and a piezoelectric material.

The functional layer may include at least one of transition metal oxide (TMO), a chalcogenide material, a perovskite material, a two-dimensional (2D) material, and an organic material.

The graphene device may further include at least one of a first insertion layer between the functional layer and the graphene layer, and a second insertion layer between the functional layer and the second electrode.

The first and second insertion layers may be semiconductors or insulators.

The gate insulation layer may be on the gate, the graphene layer may be on the gate insulation layer, the first and second electrodes spaced apart from each other may be on the graphene layer, and the functional layer may be between the graphene layer and the second electrode.

The graphene layer may be on a substrate, the first electrode may be on the first region of the graphene layer, the second electrode may be between the second region of the graphene layer and the substrate, the functional layer may be between the second electrode and the graphene layer, and the gate insulation layer and the gate may be sequentially located on the graphene layer on the functional layer.

The functional layer may include an n-type semiconductor or a p-type semiconductor.

The functional layer may include an ambipolar semiconductor.

The functional layer may include a plurality of layers laterally arranged, and the plurality of layers may include an n-type semiconductor layer and a p-type semiconductor layer.

The functional layer may include a plurality of layers vertically stacked, and the plurality of layers may include an n-type semiconductor layer and a p-type semiconductor layer.

The functional layer may include a phase change material. In this case, the graphene device may further include a heating electrode between the functional layer and the second electrode.

The functional layer may have optoelectronic conversion characteristics.

A second functional layer may be further located between the graphene layer and the second electrode, and the second functional layer may have optoelectronic conversion characteristics.

At least one of the gate, the first electrode, and the second electrode may be formed of or include a transparent material.

The graphene device may be a multifunctional device.

According to another example embodiment, a graphene device includes first and second graphene layers, first and second electrode elements electrically connected to the first and second graphene layers, respectively, a third electrode element corresponding to a portion of the first graphene layer and a portion of the second graphene layer, a first functional layer between the third electrode element and the first graphene layer, a second functional layer between the third electrode element and the second graphene layer, a gate spaced apart from the first and second graphene layers, and a gate insulation layer between the gate and the first and second graphene layers. At least one of the first and second functional layers has at least one of optoelectronic conversion characteristics, nonvolatile memory characteristics, and piezoelectric characteristics.

One of the first and second functional layers may be an n-type semiconductor, and the other may be a p-type semiconductor.

The graphene device may have a complementary inverter structure.

The graphene device may have an ambipolar transistor structure.

At least one of the first and second functional layers may include at least one of a light emission material, a photoactive material, a resistance change material, a phase change material, a ferroelectric material, a multiferroic material, multistable molecules, and a piezoelectric material.

At least one of the first and second functional layers may include at least one of a Group III and V elements-containing compound, TMO, a chalcogenide material, a perovskite material, a 2D material, and an organic material.

The graphene device may further include at least one of a first insertion layer between the first functional layer and the first graphene layer, a second insertion layer between the first functional layer and the third electrode element, a third insertion layer between the second functional layer and the second graphene layer, and a fourth insertion layer between the second functional layer and the third electrode element.

According to another example embodiment, a graphene device includes a graphene layer, a first electrode electrically connected to a first region of the graphene layer, a second electrode corresponding to a second region of the graphene layer, a functional layer comprising a plurality of layers laterally arranged between the graphene layer and the second electrode, wherein at least one of the plurality of layers has at least one of optoelectronic conversion characteristics, nonvolatile memory characteristics, and piezoelectric characteristics, a gate facing the functional layer with the graphene layer therebetween, and a gate insulation layer between the graphene layer and the gate.

The plurality of layers may include a first layer and a second layer, the first layer may be an n-type semiconductor, and the second layer may be a p-type semiconductor.

The plurality of layers may include a first layer and a second layer, and the first layer may have one of optoelectronic conversion characteristics, nonvolatile memory characteristics, and piezoelectric characteristics. For example, the second layer may have another one of optoelectronic conversion characteristics, nonvolatile memory characteristics, and piezoelectric characteristics.

The graphene device may further include at least one of a first insertion layer between the functional layer and the graphene layer, and a second insertion layer between the functional layer and the second electrode.

According to another example embodiment, a graphene device includes a graphene layer, a first electrode electrically connected to a first region of the graphene layer, a second electrode corresponding to a second region of the graphene layer, a functional layer comprising a plurality of layers vertically stacked between the graphene layer and the second electrode, wherein each of the plurality of layers has at least one of optoelectronic conversion characteristics, nonvolatile memory characteristics, and piezoelectric characteristics, a gate facing the functional layer with the graphene layer therebetween, and a gate insulation layer between the graphene layer and the gate.

The plurality of layers may include a first layer and a second layer, the first layer may be an n-type semiconductor, and the second layer may be a p-type semiconductor.

The plurality of layers may include a first layer and a second layer. The first layer may have one of optoelectronic conversion characteristics, nonvolatile memory characteristics, and piezoelectric characteristics, and the second layer may have another of optoelectronic conversion characteristics, nonvolatile memory characteristics, and piezoelectric characteristics.

The graphene device may further include at least one of a first insertion layer between the functional layer and the graphene layer, and a second insertion layer between the functional layer and the second electrode.

According to at least one example embodiment, a graphene device includes at least one graphene layer, at least one electrode element electrically connected to the at least one graphene layer, at least one functional layer between the at least one electrode element and the at least one graphene layer, wherein the at least one functional layer has at least one of optoelectronic conversion characteristics, nonvolatile memory characteristics, piezoelectric characteristics, an n-type semiconductor and a p-type semiconductor.

BRIEF DESCRIPTION OF THE DRAWINGS

These and/or other example embodiment will become apparent and more readily appreciated from the following description, taken in conjunction with the accompanying drawings in which.

DETAILED DESCRIPTION

Figure 1:
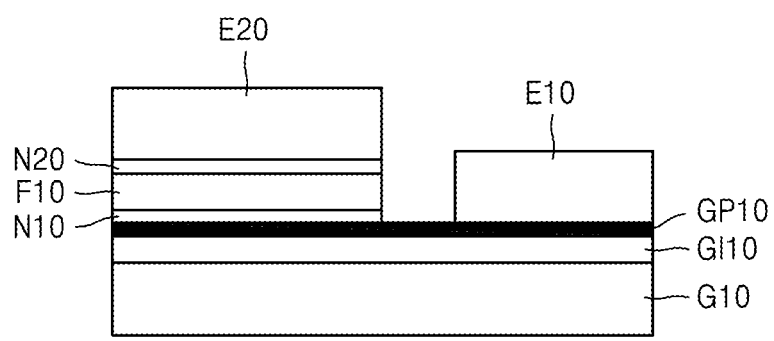
FIG. 1 is a cross-sectional view of a graphene device according to at least one example embodiment.

Various example embodiments will now be described more fully with reference to the accompanying drawings in which example embodiments are shown.

It will be understood that when an element is referred to as being "on," "connected" or "coupled" to another element, it can be directly on, connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list. Hereinafter, graphene devices, methods of manufacturing and operating the graphene devices, and electronic apparatuses including the graphene device, according to example embodiments, will be described more fully with reference to the accompanying drawings. In the drawings, the widths and thicknesses of layers and regions are exaggerated for clarity. Like reference numerals in the drawings denote like elements.

FIG. 1 is a cross-sectional view of a graphene device according to an example embodiment. The graphene device according to the present embodiment may be a multifunctional graphene device.

Referring to FIG. 1, the graphene device according to the present embodiment may include a graphene layer GP10 and a functional layer F10 contacting the graphene layer GP10. The graphene layer GP10 may include about 1 to about 100 layers (or about 1 to about 10 layers) of graphene. In other words, the graphene layer GP10 may be formed of or include a single graphene layer or a stack of about 100 or less graphene layers (or about 10 or less graphene layers). The functional layer F10 may be a layer having a desired, or alternatively predetermined function(s). The functional layer F10 will be described later in detail.

A first electrode E10 electrically connected to a first region of the graphene layer GP10 may be included. A second electrode E20 may be included to correspond to a second region of the graphene layer GP10. The first electrode E10 may be a source electrode and the second electrode E20 may be a drain electrode. Alternatively, the first electrode E10 may be a drain electrode, and the second electrode E20 may be a source electrode. The functional layer F10 may be between the graphene layer GP10 and the second electrode E20. A gate G10 facing the functional layer F10 with the graphene layer GP10 therebetween may be included. A gate insulation layer GI10 may be between the graphene layer GP10 and the gate G10.

As needed, a first insertion layer N10 may be between the functional layer F10 and the graphene layer GP10. A second insertion layer N20 may be between the functional layer F10 and the second electrode E20. The first and second insertion layers N10 and N20 may be semiconductors or insulators. The first and second insertion layers N10 and N20 may be formed of or include a two-dimensional (2D) material or a material (e.g., a bulky material) other than a 2D material. One of the first and second insertion layers N10 and N20 may be included, or both of them may be included. When both the first and second insertion layers N10 and N20 are included, they may have different characteristics or identical characteristics. Alternatively, none of the first and second insertion layers N10 and N20 may be included.

According to the present embodiment, the gate insulation layer GI10 may be on the gate G10, and the graphene layer GP10 may be on the gate insulation layer GI10. The first and second electrodes E10 and E20 spaced apart from each other may be on the graphene layer GP10. The functional layer F10 may be between the graphene layer GP10 and the second electrode E20. In this case, the gate G10 may serve as a substrate. Alternatively, a special substrate (not shown) may be further below the gate G10.

The functional layer F10 may be a material layer having a desired, or alternatively predetermined function(s) and may include a semiconductor or a dielectric (insulator). The functional layer F10 may have a property (function) that is at least one of nonvolatile memory characteristics, piezoelectric characteristics, and optoelectronic conversion characteristics. When the functional layer F10 has nonvolatile memory characteristics, the functional layer F10 may include at least one of a resistance change material, a phase change material, a ferroelectric material, a multiferroic material, and multistable molecules. When the functional layer F10 has piezoelectric characteristics, the functional layer F10 may include a desired, or alternatively predetermined piezoelectric material. When the functional layer F10 has optoelectronic conversion characteristics, the functional layer F10 may include a light emission material or a photoactive material. For example, the functional layer F10 may include transition metal oxide (TMO), a chalcogenide material, a perovskite material, or a Group III and V elements-containing compound. The functional layer F10 may include a 2D material or an organic material. The functional layer F10 may include TMO, such as TiOx, TaOx, NiOx, CuOx, or ZnOx, may include a chalcogenide material, such as Ge—Sb—Te or GeTe—Sb2Te3, may include a perovskite material, such as SrTiO3, BaTiO3, or lead zirconate titanate (PZT), may include a Group III and V elements-containing compound, such as GaN or InAs, may include a carbon-based compound, such as graphene oxide, or may include an organic material, such as rotaxane. TiOx, TaOx, NiOx, CuOx, and graphene oxide may be resistance change materials, and Ge—Sb—Te and GeTe—Sb2Te3 may be phase change materials. SrTiO3, BaTiO3, and PZT may be ferroelectric materials. PZT may be a ferroelectric material and simultaneously a piezoelectric material. ZnOx may have piezoelectric characteristics, and rotaxane may be multistable molecules. GaN and InAs may be light emission materials. The functional layer F10 may include a 2D material such as MoS2, MoSe2, MoTe2, WS2, WSe2, or WTe2. The 2D material may be a photoactive material or a light emission material. However, the aforementioned materials are examples, and various other materials may be used to form the functional layer F10. In other words, the functional layer F10 may be formed of or include any material as long as the material is able to form a channel of a transistor together with the graphene layer GP10 while having at least one of nonvolatile memory characteristics, piezoelectric characteristics, and optoelectronic conversion characteristics.

The TMO is a combination of a transition metal and oxygen, and includes various materials as examples thereof. The TMO may be used in various fields, such as, a channel material of a transistor, a resistive memory material, a ferroelectric material, a piezoelectric material, and an optoelectronic conversion material. Accordingly, suitably-selected TMO may be applied to form multifunctional graphene devices according to example embodiments. In addition, TMO may be more useful in terms of easy manufacturing and applicability to a large area process than 2D materials. In other words, when a 2D material is used, a transfer process may be required, and it may be difficult to conduct a large area process. However, when TMO is used, manufacture and processing/handling may be easy, and application to a large area process may also be easy. Thus, according to an example embodiment, a graphene device that is advantageous in terms of easy manufacture and applicability to a large area process may be obtained. However, the material used to form the functional layer F10 according to the present embodiment is not limited to TMO, and the above-described various other materials may be used to form the functional layer F10.

When the functional layer F10 includes a semiconductor, the functional layer F10 may include an n-type semiconductor or a p-type semiconductor. For example, TiOx, TaOx, GaN, and InAs may be n-type semiconductors, and NiOx and CuOx may be p-type semiconductors. MoS2, MoSe2, MoTe2, and WTe2 may be n-type semiconductors, and WS2 may be a p-type semiconductor. Alternatively, the functional layer F10 may include an ambipolar semiconductor. For example, WSe2 may be an ambipolar semiconductor. The functional layer F10 may include both an n-type semiconductor and a p-type semiconductor. In this case, within the functional layer F10, the n-type semiconductor and the p-type semiconductor may be laterally arranged or vertically stacked. This will be described later in more detail with reference to FIGS. 11 and 13. The functional layer F10 may have a thickness of several Å to several thousands of Å. For example, the functional layer F10 may have a thickness of about 4 Å to about 2000 Å.

When the first and second insertion layers N10 and N20 are used, they may be semiconductors or insulators. For example, at least one of the first and second insertion layers N10 and N20 may be a thin insulation layer such as an Al2O3 layer formed by atomic layer deposition (ALD) or may be a hexagonal boron nitride (h-BN) layer which is an insulating 2D material layer. Alternatively, at least one of the first and second insertion layers N10 and N20 may be formed of or include TMO or may be an organic semiconductor or a 2D semiconductor. When optoelectronic conversion characteristics of the functional layer F10 are used, that is, when the functional layer F10 is a light emission layer or a photoactive layer, at least one of the first and second insertion layers N10 and N20 may help charge (electrons/holes) to be transported. In other words, at least one of the first and second insertion layers N10 and N20 may be an electron transport layer or a hole transport layer. When the first insertion layer N10 is an electron transport layer, the second insertion layer N20 may be a hole transport layer. On the other hand, when the first insertion layer N10 is a hole transport layer, the second insertion layer N20 may be an electron transport layer. However, the aforementioned materials and functions of the first and second insertion layers N10 and N20 are only examples and accordingly may vary.

At least one of the gate G10 and the first and second electrodes E10 and E20 may include a metal or a metal compound, may include a 2D conductor such as graphene, or may include a combination of at least two of a metal, a metal compound, and a 2D conductor. Alternatively, at least one of the gate G10 and the first and second electrodes E10 and E20 may have a structure in which a plurality of carbon nanotubes (CNTs), a plurality of metal nanowires, or a plurality of graphene flakes are networked within an organic layer. In this case, even when the graphene device is bent or stretched in a desired, or alternatively predetermined direction, the gate G10 and the first and second electrodes E10 and E20 may flexibly cope with deformation and may maintain their intrinsic functions. At least one of the gate G10 and the first and second electrodes E10 and E20 may be formed of or include a transparent material. When the optoelectronic conversion characteristics of the functional layer F10 are used, at least the gate G10 and the second electrode E20 are formed of or include a transparent material to facilitate access of light to the functional layer F10 or emission (extraction) of light from the functional layer F10.

The gate insulation layer GI10 may be formed of or include a 2D insulator (e.g., h-BN) or a general insulation material (e.g., silicon oxide, silicon oxynitride, aluminum oxide, or hafnium oxide) other than a 2D material. When the gate insulation layer GI10 is formed of or include h-BN, which is a 2D insulator, graphene may be directly grown on the h-BN, thereby facilitating formation of the graphene layer GP10. In some cases, the gate insulation layer GI10 may be formed of or include an organic insulator.

When the gate G10 or both the gate G10 and a substrate (not shown) disposed below the gate G10 has flexible or stretchable characteristics, the graphene device may operate as a flexible device or a stretchable device. When the gate G10 or both the gate G10 and the substrate disposed below the gate G10 is transparent and the other components, such as the first and second electrodes E10 and E20, are transparent, the graphene device may operate as a transparent device. Accordingly, a graphene device according to an example embodiment may be manufactured as a transparent device, a flexible device, a stretchable device, or the like and thus may be used in various fields.

Various functions/characteristics of a graphene device according to an example embodiment will now be described in more detail.

Switching Device (Electronic Device/Transistor)

When a voltage is applied between the first electrode E10 (e.g., a source electrode) and the second electrode E20 (e.g., a drain electrode) and a desired, or alternatively predetermined voltage (gate voltage) is applied to the gate G10, the graphene device may operate as a switching device (electronic device/transistor). According to the voltage applied to the gate G10, a work function of the graphene layer GP10 may vary, and the height of an energy barrier (i.e., an electrical barrier) between the graphene layer GP10 and the functional layer F10 may be adjusted. Consequently, the graphene device may be controlled to be turned on or off. When the height of the energy barrier is increased, the graphene device may be in an off state where no current substantially flows between the first electrode E10 and the second electrode E20. When the height of the energy barrier is decreased, the graphene device may be in an on state where a current flows between the first electrode E10 and the second electrode E20. When the functional layer F10 is an n-type semiconductor, the graphene device may operate as an n-type transistor. When the functional layer F10 is a p-type semiconductor, the graphene device may operate as a p-type transistor. When the functional layer F10 is an ambipolar semiconductor, the graphene device may operate as an ambipolar transistor. Even when the functional layer F10 is a dielectric layer, the graphene device may be turned on or off due to adjustment of the height of the energy barrier between the graphene layer GP10 and the functional layer F10. When the functional layer F10 is a dielectric layer, the functional layer F10 may have a relatively small thickness (e.g., about 10 nm or less or about 5 nm or less), and thus conduction characteristics may be obtained due to tunneling. For the above-described reason, the graphene layer GP10 and the functional layer F10 may constitute a single channel. When the first insertion layer N10 is included between the graphene layer GP10 and the functional layer F10 and the first insertion layer N10 is a semiconductor, the energy barrier between the graphene layer GP10 and the first insertion layer N10 may be adjusted using the gate G10, and thus the characteristics of a switching device (electronic device/transistor) may be realized. When the first insertion layer N10 is an insulation layer and has a very small thickness (e.g., about 5 nm or less), the energy barrier between the graphene layer GP10 and the functional layer F10 may be maintained, and the principle of adjusting the height of the energy barrier may be equally used in this case. In addition, when the first insertion layer N10 is an insulation layer and the first insertion layer N10 has a very small thickness (e.g., about 5 nm or less), the first insertion layer N10 may operate as a tunneling layer. When the first insertion layer N10 is included, the graphene layer GP10, the first insertion layer N10, and the functional layer F10 may constitute a single channel. When both the first and second insertion layers N10 and N20 are included, the graphene layer GP10, the first and second insertion layers N10 and N20, and the functional layer F10 may constitute a single channel. As such, a graphene device according to an example embodiment may function as a switching device (electronic device/transistor), and thus various logic devices such as an inverter may be configured using the graphene device.

Nonvolatile Memory Device

To operate as a nonvolatile memory device, when a set voltage or a reset voltage is applied between the first electrode E10 and the second electrode E20, the resistance of the functional layer F10 may change, the phase thereof may change, the direction of an electric dipole of the functional layer F10 may change, or a molecular structure of the functional layer F10 may change. Thus, a resistance state (namely, a resistance value) between the graphene layer GP10 and the second electrode E20 may change. The change of the resistance of the functional layer F10 may result from, for example, creation or extinction of a conducting filament within the functional layer F10. According to this principle, a resistive memory device (namely, resistive random access memory (RRAM)) may be realized. The change of the phase of the functional layer F10 may denote a change in the phase between non-crystalline and crystalline. According to this principle, a phase-change memory device (namely, phase-change random access memory (PRAM)) may be realized. The change in the direction of the electric dipole of the functional layer F10 may result from the characteristics of ferroelectrics. According to this principle, a ferroelectric memory device (namely, ferroelectric random access memory (FRAM)) may be realized. The change in the molecular structure of the functional layer F10 may result from the characteristics of multistable molecules. According to this principle, a molecular memory device/molecular switch may be realized. When such a nonvolatile memory device is realized, at least two states (for example, four states) may be obtained as the resistance states of the functional layer F10, namely, resistance states between the graphene layer GP10 and the second electrode E20, due to application of a desired, or alternatively predetermined voltage to the gate G10, because the resistance of the functional layer F10 may be affected also by the voltage applied to the gate G10. Thus, a multi-level memory device may be realized by applying a suitable voltage to the gate G10. In addition, a set/reset voltage may be changed by applying a desired, or alternatively predetermined voltage to the gate G10.

Piezoelectric Device

When the functional layer F10 has piezoelectric characteristics, electrical energy may be generated within the functional layer F10 due to a mechanical deformation of the functional layer F10. In other words, when pressure is vertically or horizontally applied to the graphene device, electrical energy may be generated within the functional layer F10, and thus a voltage may be generated between the graphene layer GP10 and the second electrode E20, and consequently, between the first electrode E10 and the second electrode E20. Since the graphene device may be a flexible device, a stretchable device, or a rollable device, the graphene device may be suitable to be applied as a piezoelectric device. Due to the function of the piezoelectric device, the graphene device may be used as a sensor (piezoelectric sensor) that senses external vibration or as an energy harvester that harvests electrical energy due to external vibration.

Optoelectronic Device

When the functional layer F10 has optoelectronic conversion characteristics, the functional layer F10 may have a property of converting optical energy to electrical energy or a property of converting electrical energy to optical energy. When the functional layer F10 has the property of converting optical energy to electrical energy, light may be absorbed by the functional layer F10, and thus electrons and holes may be generated. The electrons and holes may be moved to the second electrode E20 and the graphene layer GP10, thereby obtaining electrical energy (an electrical signal). According to this principle, a photovoltaic device, a photodetector, or a phototransistor may be realized. When the functional layer F10 has the property of converting electrical energy to optical energy, light may be generated in the functional layer F10 by applying a voltage between the graphene layer GP10 and the second electrode E20. According to this principle, a luminous device or a light emitting device, such as a light emitting diode (LED) or a laser diode (LD), may be realized. Accordingly, the graphene device may be considered as a light emitting transistor. According to a voltage applied to the gate G10, the light emission characteristics or photovoltaic characteristics of the functional layer F10 may be controlled. Accordingly, a graphene device according to an example embodiment may be a device of which light emission characteristics or photovoltaic characteristics may be easily controlled.

According to materials used to form the functional layer F10, a bandgap of the functional layer F10 may be controlled within a wide range. In other words, the wavelength of light corresponding to the bandgap of the functional layer F10 may vary from an ultraviolet ray region (about 400 nm or less) to a visible ray region (about 400 to 700 nm) and to an infrared ray region (~2000 nm). The bandgap of the functional layer F10 may have a range of 0.4 to 4 eV. By increasing the thickness of the functional layer F10, a light absorption factor may be easily increased. When the functional layer F10 is a 2D material, a width of the bandgap, which is controllable, is relatively small. When the 2D material is not a monolayer, an indirect bandgap may be formed. In addition, when the functional layer F10 is a 2D material, controlling the thickness of the functional layer F10 may not be easy. In this respect, forming the functional layer F10 of a material (bulky material) other than a 2D material may be advantageous during application to optoelectronic devices. The material other than a 2D material, namely, a non-2D material, may also be advantageous in terms of easy manufacture and applicability to a large area process.

According to an example embodiment, when the graphene layer GP10 and the functional layer F10 are used, not only a switching device (electronic device/transistor) having excellent performance in terms of mobility, an on/off ratio, and the like but also a multi-functional graphene device having at least one of various functions (e.g., a memory function, a piezoelectric function, and an optoelectronic function) within the structure of a switching device (electronic device/transistor) may be realized. In other words, a graphene device according to an example embodiment may be a multi-functional device that has a function of a switching device (transistor) and also a function of another device, for example, a memory device, a piezoelectric device, or an optoelectronic device. The graphene device may have both a function of a switching device (transistor) and a function of a memory device, both a function of a switching device (transistor) and a function of a piezoelectric device, or both a function of a switching device (transistor) and a function of an optoelectronic device. Alternatively, the graphene device may have at least two of the characteristics of a memory device, those of a piezoelectric device, and those of an optoelectronic device in addition to the function of a switching device (transistor), because the functional layer F10 may have at least one of memory characteristics, piezoelectric characteristics, and optoelectronic conversion characteristics. Alternatively, the graphene device may have a plurality of functions by using a plurality of functional layers. This will be described later in more detail with reference to FIGS. 16 and 17.

As described above, according to an example embodiment, a multi-functional device having a plurality of functions within a single device may be realized and accordingly may have various advantages. When an existing device having a single function is used, a plurality of devices having different functions are required to realize an electronic device that requires various functions, and also need to be connected to one another. Thus, various difficulties are generated in terms of process and design. However, since a graphene device according to an example embodiment implements various functions by using a single device, it may be very advantageous in terms of process and design.

According to other example embodiments, various modifications may be made to the structure of the graphene device of FIG. 1. An example modification is illustrated in FIG. 2.

Figure 2:
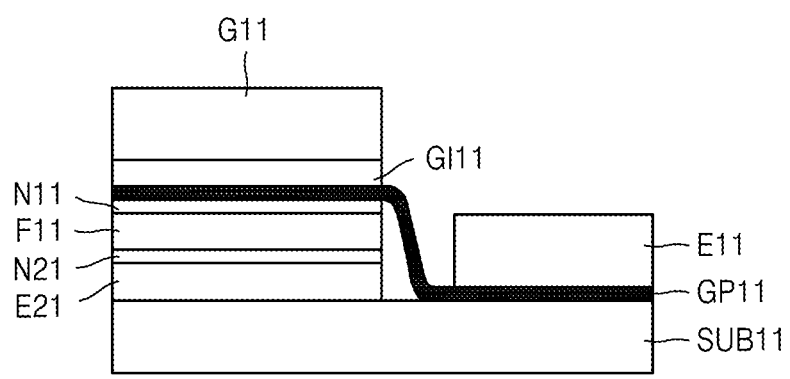
FIG. 2 is a cross-sectional view of a graphene device according to another example embodiment.

Referring to FIG. 2, a graphene layer GP11 may be on a substrate SUB11. A first electrode E11 may be on a first region of the graphene layer GP11. A second electrode E21 may be between a second region of the graphene layer GP11 and the substrate SUB11. A functional layer F11 may be between the second electrode E21 and the graphene layer GP11. A gate insulation layer GI11 and a gate G11 may be sequentially located on a portion of the graphene layer GP11 that exists on the functional layer F11. At least one of a first insertion layer N11 between the functional layer F11 and the graphene layer GP11 and a second insertion layer N21 between the functional layer F11 and the second electrode E21 may be optionally included in the graphene device of FIG. 2. The materials/characteristics of the graphene layer GP11, the functional layer F11, the first electrode E11, the second electrode E21, the gate G11, the gate insulation layer GI11, the first insertion layer N11, and the second insertion layer N21 of FIG. 2 may be the same as or similar to those of the graphene layer GP10, the functional layer F10, the first electrode E10, the second electrode E20, the gate G10, the gate insulation layer GI10, the first insertion layer N10, and the second insertion layer N20 of FIG. 1, respectively. The substrate SUB11 may include an insulation material. As necessary, the substrate SUB11 may be flexible or stretchable.

Figure 3:
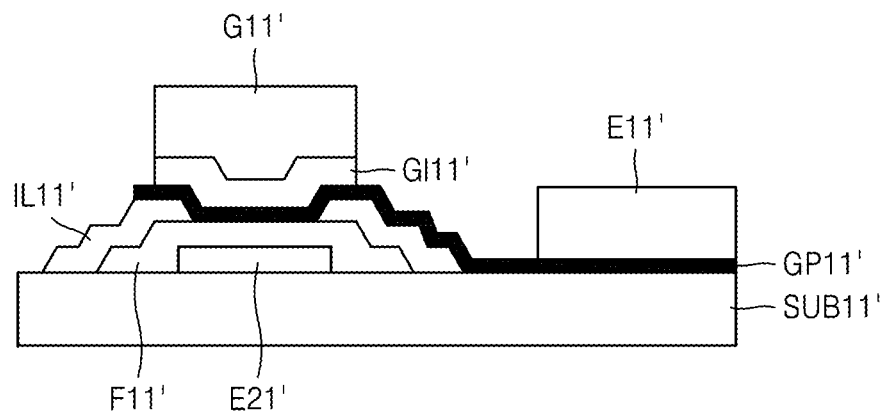
FIG. 3 is a cross-sectional view of a graphene device according to another example embodiment.

The structure of FIG. 2 may be modified into a structure of FIG. 3. FIG. 3 is a cross-sectional view of a graphene device according to another example embodiment.

Referring to FIG. 3, a second electrode E21' may be on a substrate SUB11', and a functional layer F11' may cover the second electrode E21'. An insulation layer IL11' having an aperture via which a portion (e.g., a center portion) of the functional layer F11' is exposed may be on the functional layer F11'. A graphene layer GP11' may be on the insulation layer IL11' and a portion of the substrate SUB11' adjacent to the insulation layer IL11'. The graphene layer GP11' may contact the portion of the functional layer F11' that is exposed via the aperture of the insulation layer IL11'. A gate insulation layer GI11' and a gate G11' may be sequentially located on a portion of the graphene layer GP11' that exists on the second electrode E21'. Although not shown in FIG. 3, a first insertion layer may be between the functional layer F11' and the second electrode E21', and a second insertion layer may be between the functional layer F11' and the graphene layer GP11'.

Figure 4:
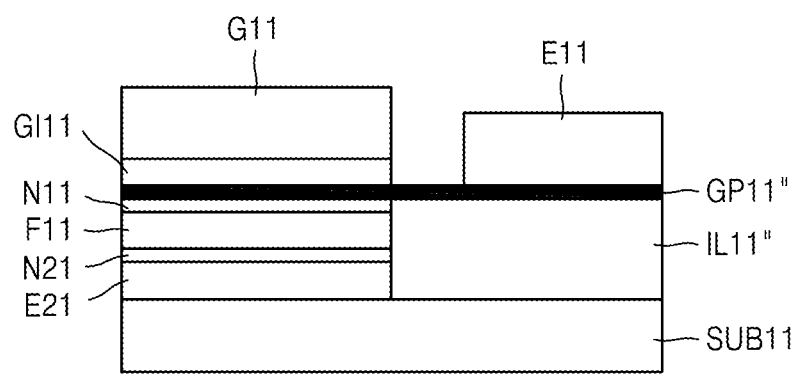
FIG. 4 is a cross-sectional view of a graphene device according to another example embodiment.

The structure of FIG. 2 may also be modified into a structure of FIG. 4. FIG. 4 is a cross-sectional view of a graphene device according to another example embodiment. The structure of FIG. 4 may be obtained by adding an insulation layer IL11" to the structure of FIG. 2.

Referring to FIG. 4, the insulation layer IL11" may be below the first electrode E11 to support the graphene layer GP11". The insulation layer IL11" may be between the substrate SUB11 and the graphene layer GP11" and may have a height that is similar to the height of the functional layer F11 or the first insertion layer N11. The insulation layer IL11" may contact a lateral surface of the second electrode E21 and a lateral surface of the functional layer F11. Due to the insulation layer IL11", the graphene layer GP11" may have a flat structure or a relatively flat structure.

Figure 5:
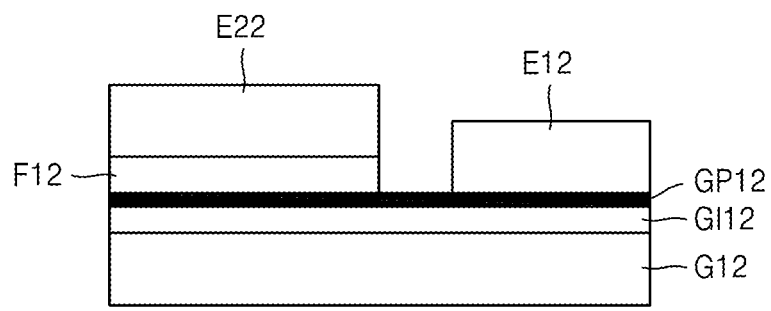
FIG. 5 is a cross-sectional view of a graphene device according to another example embodiment.

FIG. 5 is a cross-sectional view of a graphene device according to another example embodiment. According to the present embodiment, a functional layer F12 may basically have nonvolatile memory characteristics or piezoelectric characteristics.

Referring to FIG. 5, a gate insulation layer GI12 and a graphene layer GP12 may be sequentially on a gate GP12. A first electrode E12 may be on a first region of the graphene layer GP12. A second electrode E22 may be on a second region of the graphene layer GP12. The functional layer F12 may be between the graphene layer GP12 and the second electrode E22. The functional layer F12 may have nonvolatile memory characteristics or piezoelectric characteristics. When the functional layer F12 has nonvolatile memory characteristics, the graphene device according to the present embodiment may be a unit device of RRAM, FRAM, or molecular memory (molecular switch). For example, to realize RRAM, the functional layer F12 may include TiOx, TaOx, NiOx, CuOx, graphene oxide, or the like. To realize FRAM, the functional layer F12 may include a perovskite material such as SrTiO3, BaTiO3, or PZT. To realize molecular memory (molecular switch), the functional layer F12 may include multistable molecules such as rotaxane. An energy barrier may be formed between the functional layer F12 and the graphene layer GP12, and a resistance state of the functional layer F12 may vary according to a voltage applied between the first electrode E12 and the second electrode E22. The resistance state may have two or more various values according to a voltage applied to the gate G12. When the functional layer F12 has piezoelectric characteristics, the graphene device according to the present embodiment may be a device (i.e., a piezoelectric device) that generates a voltage between the first electrode E12 and the second electrode E22 due to mechanical deformation of the functional layer F12 caused by external pressure, a stress, or the like. In this case, the functional layer F12 may include a perovskite material such as PZT or may include TMO such as ZnOx. According to the present embodiment, the functional layer F12 may include a 2D material. Although not shown in FIG. 5, a first insertion layer may be between the functional layer F12 and the graphene layer GP12, and a second insertion layer may be between the functional layer F12 and the second electrode E22.

Figure 6:
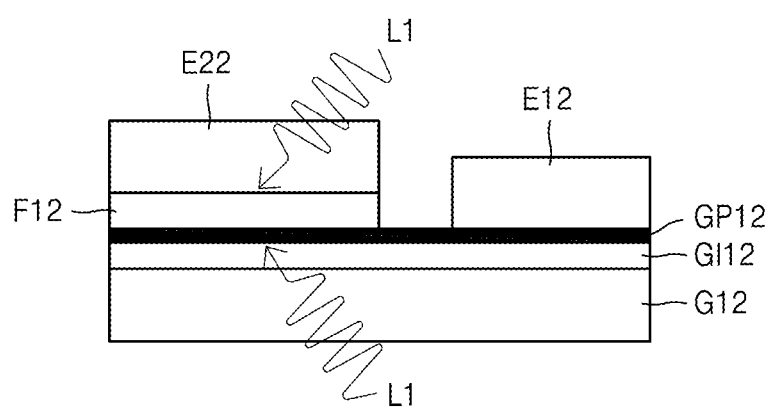
FIG. 6 is a cross-sectional view of a graphene device according to another example embodiment.

The graphene device of FIG. 5 may be used as an optoelectronic device. To this end, at least one of the second electrode E22 and the gate G12 may be formed of or include a transparent material. The first electrode E12 may also be formed of or include a transparent material. FIG. 6 illustrates incidence of light L1 upon the functional layer F12 when the graphene device of FIG. 5 is used as an optoelectronic device. Although not illustrated in FIG. 6, the functional layer F12 may have light emission characteristics.

Figure 7:
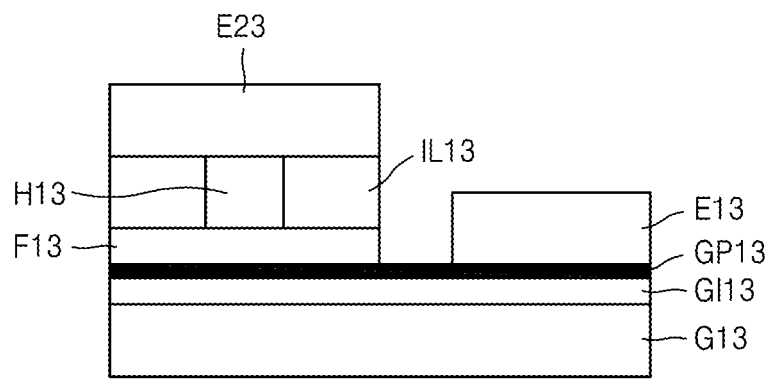
FIG. 7 is a cross-sectional view of a graphene device according to another example embodiment.

FIG. 7 is a cross-sectional view of a graphene device according to an example embodiment. According to the present embodiment, a functional layer F13 may include a phase change material, and the graphene device including the function layer F13 may have phase-change memory characteristics.

Referring to FIG. 7, the functional layer F13 may be between a graphene layer GP13 and a second electrode E23. The functional layer F13 may include a phase change material. The phase change material may be a chalcogenide material such as Ge—Sb—Te or GeTe—Sb2Te3. In this case, a heating electrode H13 may be further between the functional layer F13 and the second electrode E23. The heating electrode H13 may have a width that is smaller than the width of each of the functional layer F13 and the second electrode E23. The heating electrode H13 may be included in an insulation layer IL13. In other words, the insulation layer IL13 may be between the functional layer F13 and the second electrode E23, and the heating electrode H13 connecting the functional layer F13 to the second electrode E23 may be formed within the insulation layer 1L13. The heating electrode H13 may have a rod shape or a shape similar to the rod shape. The heating electrode H13 may be included to easily heat a portion of the functional layer F13. When a portion of the functional layer F13 (hereinafter, referred to as a first region) that contacts the heating electrode H13 is heated to a crystallization temperature or more, a crystal phase grows in the first region, and thus resistance of the functional layer F13 may decrease. When the temperature of the first region is a melting point or higher, an amorphous phase may be in the first region, and accordingly, the resistance of the functional layer F13 may increase. As such, when the functional layer F13 includes a phase change material, the graphene device according to the present embodiment may become a unit device of PRAM. A gate G13, a gate insulation layer GI13, and a first electrode E13 of FIG. 7 may be the same as or similar to their counterparts in FIG. 1. Although not illustrated in FIG. 7, an insertion layer may be between the functional layer F13 and the graphene layer GP13.

Figure 8:
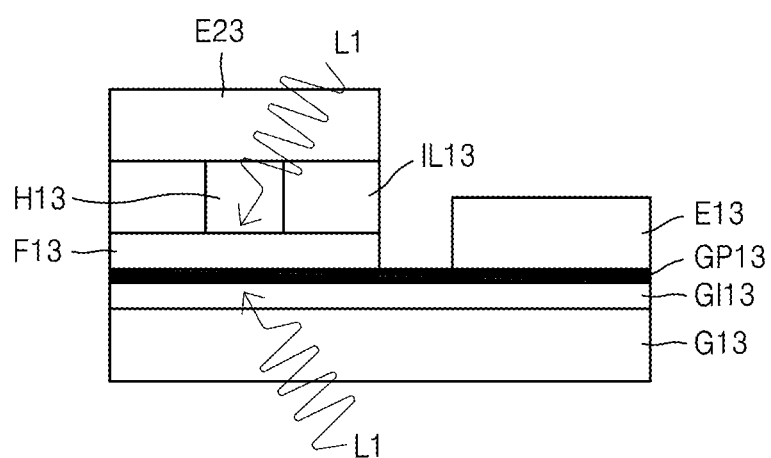
FIG. 8 is a cross-sectional view of a graphene device according to another example embodiment.

The graphene device of FIG. 7 may also be used as an optoelectronic device. To this end, at least one of the second electrode E23 and the gate G13 may be formed of or include a transparent material. The first electrode E13 may also be formed of or include a transparent material. FIG. 8 illustrates incidence of light L1 upon the functional layer F13 when the graphene device of FIG. 7 is used as an optoelectronic device. Although not illustrated in FIG. 8, the functional layer F13 may have light emission characteristics.

Figure 9:
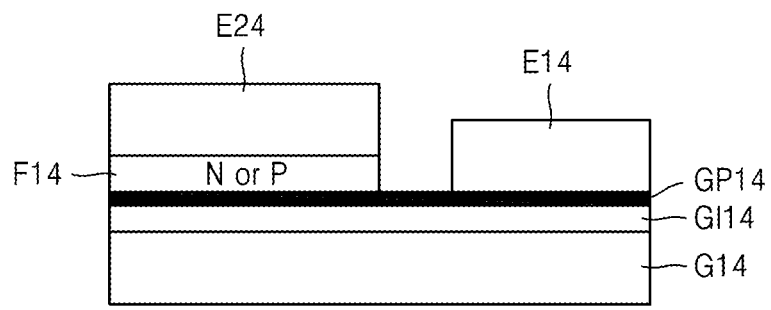
FIG. 9 is a cross-sectional view of a graphene device according to another example embodiment.

FIG. 9 is a cross-sectional view of a graphene device according to another example embodiment. The graphene device according to the present embodiment may have the characteristics of a unipolar transistor.

Referring to FIG. 9, a functional layer F14 between a graphene layer GP14 and a second electrode E24 may be an n-type semiconductor or a p-type semiconductor. A gate G14, a gate insulation layer GI14, and a first electrode E14 of FIG. 9 may be the same as or similar to their counterparts in FIG. 1. When the functional layer F14 is an n-type semiconductor, electron affinity of the functional layer F14 is about 3.0 to about 4.5 eV, and thus has a difference of about 1.5 eV upward from a Fermi energy level (about 4.5 eV) of graphene. In this case, the graphene device may operate as an n-type transistor. In other words, when a gate voltage has a positive value, the graphene device may be turned on. When the functional layer F14 is a p-type semiconductor, a sum of the electron affinity and bandgap of the functional layer F14 is about 4.5 to about 6.0 eV, and thus has a difference of about 1.5 eV downward from the Fermi energy level (about 4.5 eV) of graphene. In this case, the graphene device may operate as a p-type transistor. In other words, when the gate voltage has a negative value, the graphene device may be turned on.

Figure 10:
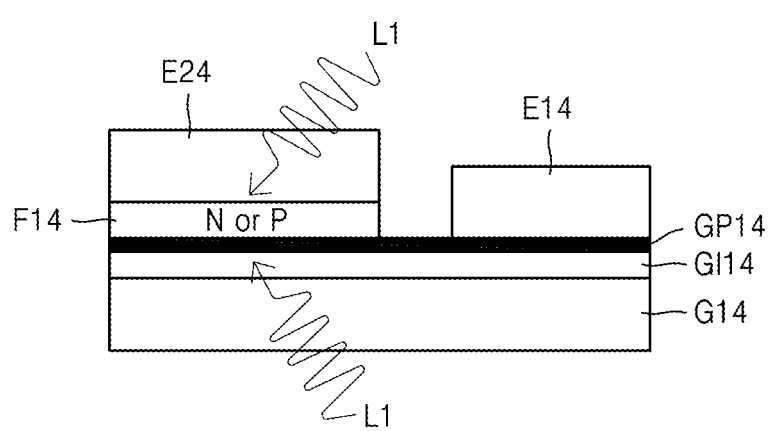
FIG. 10 is a cross-sectional view of a graphene device according to another example embodiment.

The graphene device of FIG. 9 may be used as an optoelectronic device. To this end, at least one of the second electrode E24 and the gate G10 may be formed of or include a transparent material. The first electrode E14 may also be formed of or include a transparent material. FIG. 10 illustrates incidence of light L1 upon the functional layer F14 when the graphene device of FIG. 9 is used as an optoelectronic device. The light L1 from an external source is absorbed by the functional layer F14, and thus an exciton may be generated. Electrons and holes are separated toward the second electrode E24 and the graphene layer GP14 to thereby obtain an electrical signal. In this case, respective movement characteristics of the electrons and the holes may vary according to energy band structures between the graphene layer GP14, the functional layer F14, and the second electrode E24. The graphene device according to the present embodiment may have the function of a photovoltaic device, a photodetector, or a phototransistor. According to the present embodiment, the graphene layer GP14 and the functional layer F14 may form a single channel. According to materials used to form the functional layer F14, the bandgap of the functional layer F14 may vary, and the wavelength of light corresponding to the bandgap may also vary. The wavelength of the light may have a range of, for example, about 300 nm to about 3000 nm. Although not illustrated, the functional layer F14 may have light emission characteristics. In this case, the graphene device may be used as a light emission device.

The functional layer F14 in the graphene device of FIGS. 9 and 10 may include a material having ambipolar semiconductor characteristics. In this case, the functional layer F14 may have both the characteristics of an n-type semiconductor and the characteristics of a p-type semiconductor, and the graphene device may operate as an ambipolar transistor.

Figure 11:
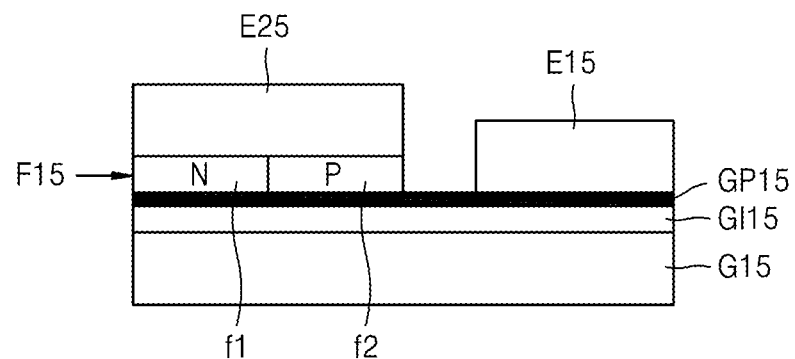
FIG. 11 is a cross-sectional view of a graphene device according to another example embodiment.

FIG. 11 is a cross-sectional view of a graphene device according to an example embodiment. The graphene device according to the present embodiment may have the characteristics of an ambipolar transistor.

Referring to FIG. 11, a functional layer F15 may include a plurality of layers f1 and f2 laterally arranged. For example, the functional layer F15 may include a first layer f1 and a second layer f2 laterally arranged. One of the first and second layers f1 and f2 may be an n-type semiconductor, and the other may be a p-type semiconductor. FIG. 11 illustrates a case where the first layer f1 is an n-type semiconductor and the second layer f2 is a p-type semiconductor. A gate G15, a gate insulation layer GI15, a graphene layer GP15, a first electrode E15, and a second electrode E25 of FIG. 11 may be the same as or similar to their counterparts in FIG. 1.

The graphene device of FIG. 11 may operate as an ambipolar device. When a positive voltage is applied to the gate G15 with a desired, or alternatively predetermined voltage applied between the first electrode (source) E15 and the second electrode (drain) E25, a channel may be in the first layer f1, which is an n-type semiconductor, and at the same time the graphene device may be turned on. When a negative voltage is applied to the gate G15 with a desired, or alternatively predetermined voltage applied between the first electrode (source) E15 and the second electrode (drain) E25, a channel may be in the second layer f2, which is a p-type semiconductor, and at the same time the graphene device may be turned on. In order for the graphene device of FIG. 11 to operate as an ambipolar device as described above, a small voltage may be applied between the first electrode E15 and the second electrode E25, and a forward leakage current may be small.

Figure 12:
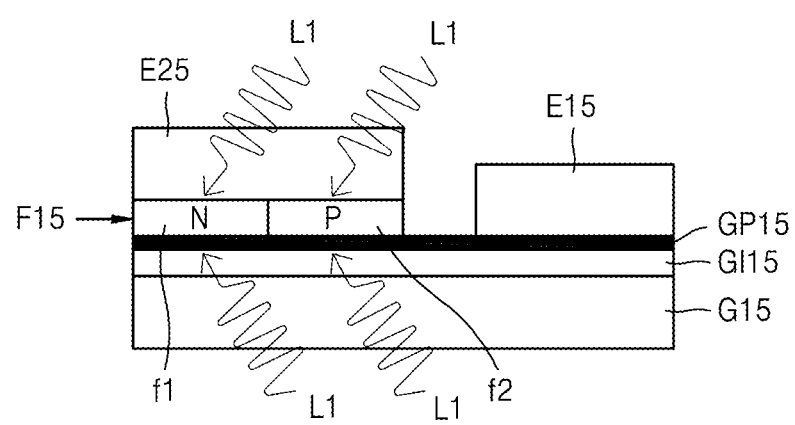
FIG. 12 is a cross-sectional view of a graphene device according to another example embodiment.

FIG. 12 illustrates a case where the graphene device of FIG. 11 is used as an optoelectronic device. In FIG. 12, at least one of the second electrode E25 and the gate G15 may be formed of or include a transparent material. The first electrode E15 may also be formed of or include a transparent material. Light L1 is incident upon the functional layer F15, and thus electrical energy may be generated. In the embodiment of FIG. 12, since the functional layer F15 includes a plurality of layers, namely, the first and second layers f1 and f2, the range of light that can be absorbed may widen, and optoelectronic conversion efficiency may increase. For example, the range of light that can be absorbed by the functional layer F15 may be from ultraviolet light to infrared light. The functional layer F15 may include three or more layers that are laterally arranged.

Figure 13:
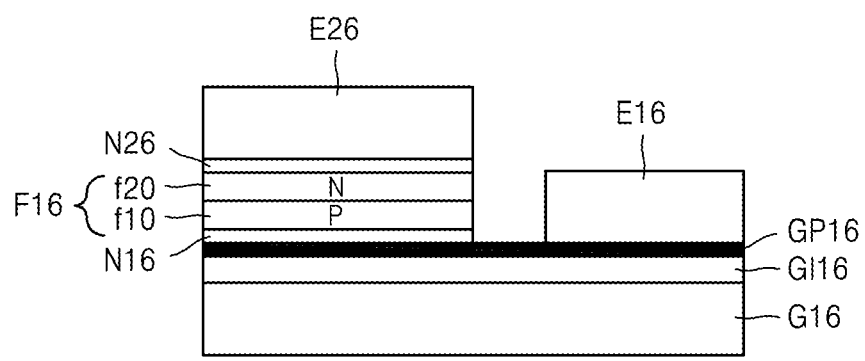
FIG. 13 is a cross-sectional view of a graphene device according to another example embodiment.

FIG. 13 is a cross-sectional view of a graphene device according to an example embodiment. The graphene device according to the present embodiment may have the function of an optoelectronic device, for example.

Referring to FIG. 13, a functional layer F16 may include a plurality of layers f10 and f20 vertically stacked on one another. For example, the functional layer F16 may include a first layer f10 and a second layer f20 vertically stacked. One of the first and second layers f10 and f20 may be a p-type semiconductor layer, and the other may be an n-type semiconductor layer. FIG. 13 illustrates a case where the first layer f10 is a p-type semiconductor and the second layer f20 is an n-type semiconductor. A first insertion layer N16 may be between the functional layer F16 and a graphene layer GP16, and a second insertion layer N26 may be between the functional layer F16 and a second electrode E26. The first and second insertion layers N16 and N26 may help transportation of charge (electrons/holes). The first and second insertion layers N16 and N26 may be an electron transport layer or a hole transport layer and thus may be formed of or include an organic semiconductor or an inorganic semiconductor. Alternatively, the first and second insertion layers N16 and N26 may be formed of or include a 2D insulator such as h-BN. In this case, since h-BN has a very small thickness, the first and second insertion layers N16 and N26 may serve as tunneling layers. The inclusion of the first and second insertion layers N16 and N26 may be optional.

Figure 14:
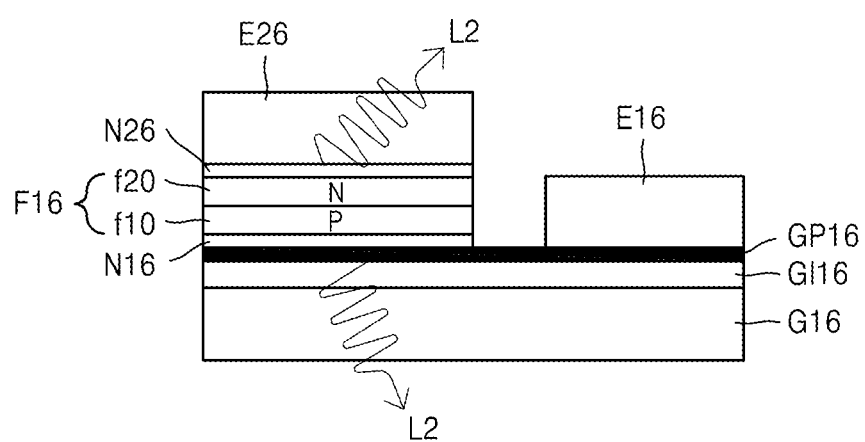
FIG. 14 is a cross-sectional view of a graphene device according to another example embodiment.
Figure 15:
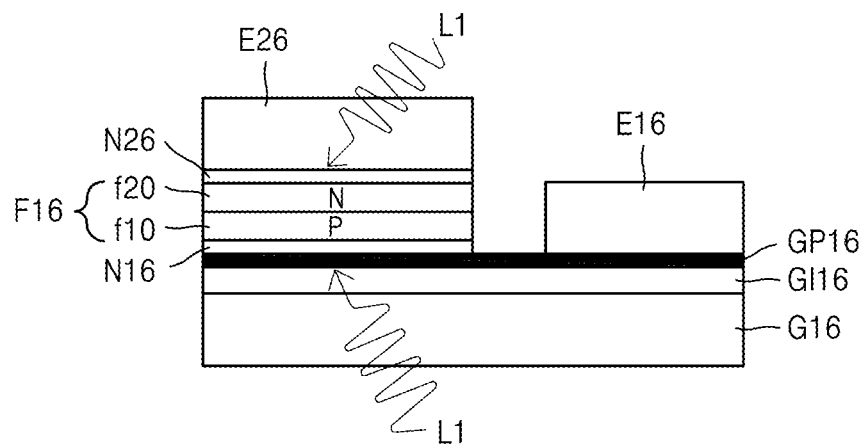
FIG. 15 is a cross-sectional view of a graphene device according to another example embodiment.

FIG. 14 illustrates a case where the graphene device of FIG. 13 has the function of a light emitting device, and FIG. 15 illustrates a case where the graphene device of FIG. 13 has the function of a photovoltaic device. In FIG. 14, reference numeral L2 indicates light emitted from the functional layer F16. When a desired, or alternatively predetermined voltage is applied between the first electrode E16 and the second electrode E26, the functional layer F16 may emit the light L2 due to the electroluminescence (EL) effect. At this time, by controlling a voltage that is to be applied to the gate G16, light emission characteristics may be changed or a light emission operation may be turned on or may be turned off. In the graphene device of FIG. 15, as light L1 is radiated toward the functional layer F16, electrical energy may be generated within the functional layer F16. In FIG. 14, the functional layer F16 may include an inorganic light-emission material or an organic light-emission material. In FIG. 15, the functional layer F16 may include an inorganic photoactive material or an organic photoactive material. The inorganic light-emission material may be a Group III-V elements-containing compound, for example, GaN or InAs. The graphene device of FIG. 15 may be used as a photodetector or a phototransistor. In FIGS. 14 and 15, at least one of the gate G16 and the second electrode E26 may be a transparent electrode, and the first electrode E16 may also be a transparent electrode.

In the structure of FIGS. 14 and 15, the functional layer F16 may include three or more layers vertically stacked. In this case, the functional layer F16 may include an active layer (a light emitting layer or a photoactive layer), an n-type semiconductor layer, and a p-type semiconductor.

Figure 16:
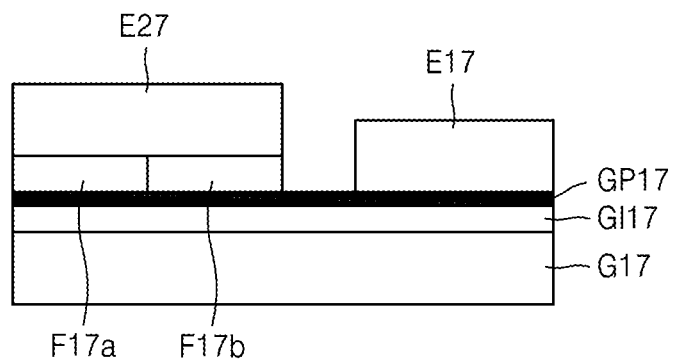
FIG. 16 is a cross-sectional view of a graphene device according to another example embodiment.
Figure 17:
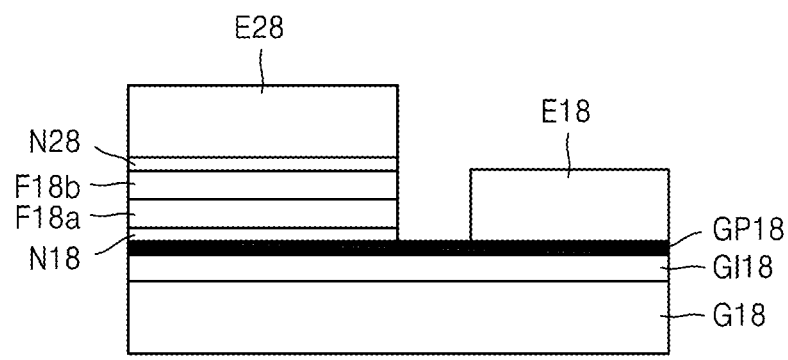
FIG. 17 is a cross-sectional view of a graphene device according to another example embodiment.

According to other embodiments, a plurality of functional layers having different functions may be used. In other words, a first functional layer having a first function and a second functional layer having a second function may be applied to a single device. As necessary, a third functional layer having a third function may be further applied. FIGS. 16 and 17 are cross-sectional views illustrating cases where a plurality of functional layers having different functions are used. The structures of FIGS. 16 and 17 may be similar to those of FIGS. 11 and 13, respectively.

Referring to FIG. 16, a plurality of functional layers F17a and F17b may be laterally arranged between a graphene layer GP17 and a second electrode E27. The plurality of functional layers F17a and F17b may be, for example, a first functional layer F17a and a second functional layer F17b. The first functional layer F17a may have one from among optoelectronic conversion characteristics, nonvolatile memory characteristics, and piezoelectric characteristics, and the second functional layer F17b may have another. In this case, the graphene device of FIG. 16 has the function of a switching device (electronic device/transistor) and at the same time may also have two of optoelectronic conversion characteristics, nonvolatile memory characteristics, and piezoelectric characteristics. In FIG. 16, reference numerals G17, GI17, and E17 indicate a gate, a gate insulation layer, and a first electrode, respectively.

Referring to FIG. 17, a plurality of functional layers F18*a* and F18*b* may be vertically stacked between a graphene layer GP18 and a second electrode E28. The plurality of functional layers F18*a* and F18*b* may be, for example, a first functional layer F18*a* and a second functional layer F18*b*. The first functional layer F18*a* may have one from among optoelectronic conversion characteristics, nonvolatile memory characteristics, and piezoelectric characteristics, and the second functional layer F18*b* may have another. In this case, the graphene device of FIG. 17 has the function of a switching device (electronic device/transistor) and at the same time may also have two of optoelectronic conversion characteristics, nonvolatile memory characteristics, and piezoelectric characteristics. In FIG. 17, reference numerals G18, GI18, and E18 indicate a gate, a gate insulation layer, and a first electrode, respectively.

Each of the graphene devices of FIGS. 16 and 17 may include three or more functional layers. At least a portion of the functional layers F17*a* and F17*b* of FIG. 16 may be combined with at least a portion of the functional layers F18*a* and F18*b* of FIG. 17. Accordingly, various graphene devices may be realized.

Figure 18:
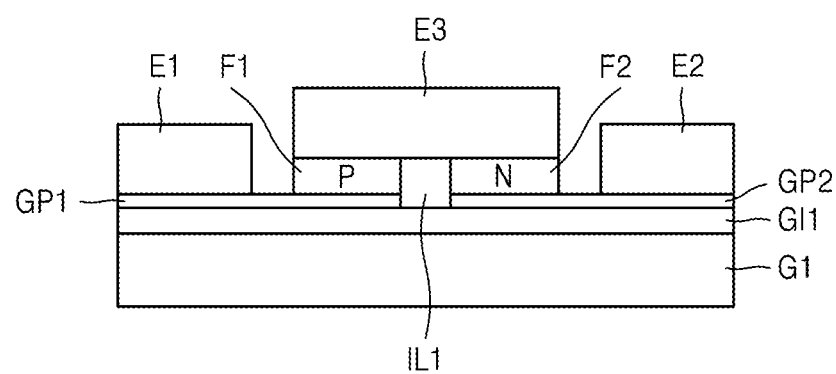
FIG. 18 is a cross-sectional view of a graphene device according to another example embodiment.

FIG. 18 is a cross-sectional view of a graphene device according to another example embodiment.

Referring to FIG. 18, a first graphene layer GP1 and a second graphene layer GP2 may be included. For example, the first and second graphene layers GP1 and GP2 may be arranged side by side to be spaced apart from each other. A first electrode element E1 electrically connected to a first region of the first graphene layer GP1 may be included. A second electrode element E2 electrically connected to a first region of the second graphene layer GP2 may be included. A third electrode element E3 corresponding to a portion (i.e., a second region) of the first graphene layer GP1 and a portion (i.e., a second region) of the second graphene layer GP2 may be included. The third electrode element E3 may be disposed between the first electrode element E1 and the second electrode element E2 so as to be spaced apart therefrom. A first functional layer F1 may be between the third electrode element E3 and the first graphene layer GP1. A second functional layer F2 may be between the third electrode element E3 and the second graphene layer GP2. The first and second functional layers F1 and F2 may be spaced apart from each other or may contact each other. FIG. 18 illustrates a case where the first and second functional layers F1 and F2 may be spaced apart from each other. In this case, an insulation layer IL1 may be included to fill the space between the first and second functional layers F1 and F2 and the space between the first and second graphene layers GP1 and GP2. The insulation layer IL1 may be formed of or include a 2D insulator such as h-BN or of an insulator other than a 2D material. A gate G1 spaced apart from the first and second graphene layers GP1 and GP2 may be included. A gate insulation layer GI1 may be between the gate G1 and the first and second graphene layers GP1 and GP2.

According to the present embodiment, the gate insulation layer GI1 may be on the gate G1, the first and second graphene layers GP1 and GP2 may be on the gate insulation layer GI1, and the first, second, and third electrode elements E1, E2, and E3 may be on the first and second graphene layers GP1 and GP2. The first functional layer F1 may be disposed between the first graphene layer GP1 and the third electrode element E3, and the second functional layer F2 may be disposed between the second graphene layer GP2 and the third electrode element E3.

At least one of the first and second functional layers F1 and F2 may correspond to the functional layer F10 of FIG. 1. Accordingly, at least one of the first and second functional layers F1 and F2 may have at least one of optoelectronic conversion characteristics, nonvolatile memory characteristics, and piezoelectric characteristics. The first and second functional layers F1 and F2 may include different materials and may have different physical properties. For example, one of the first and second functional layers F1 and F2, for example, the first functional layer F1, may be a p-type semiconductor, and the other, for example, the second functional layer F2, may be an n-type semiconductor. In this case, the graphene device according to the present embodiment may have a complementary inverter structure.

When the graphene device of FIG. 18 has a complementary inverter structure, the first electrode E1 may be connected to a power supply terminal (not shown). The second electrode E2 may be connected to a ground terminal (not shown). In other words, the second electrode E2 may be grounded. The gate G1 may be connected to an input terminal (not shown). The third electrode E3 may be connected to an output terminal (not shown). According to an input signal (voltage) applied to the gate G1 via the input terminal, the first and second functional layers F1 and F2 may be turned on or off, and a signal output via the output terminal may be changed. For example, when a signal corresponding to '1' is input to the input terminal, a signal corresponding to '0' may be output via the output terminal. On the other hand, when a signal corresponding to '0' is input to the input terminal, a signal corresponding to '1' may be output via the output terminal. Accordingly, the graphene device of FIG. 18 may perform an inverter function.

Figure 19:
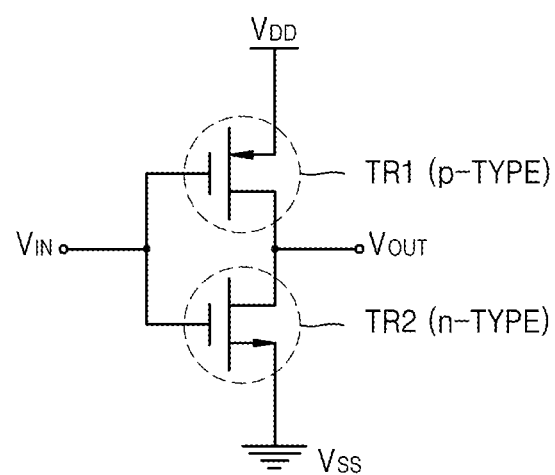
FIG. 19 is a circuit diagram showing a circuit configuration when the graphene device of FIG. 18 is used as an inverter.

FIG. 19 is a circuit diagram showing a circuit configuration when the graphene device of FIG. 18 is used as an inverter.

Referring to FIG. 19, a first transistor TR1 and a second transistor TR2 are connected to each other. The first transistor TR1 may be p-type, whereas the second transistor TR2 may be n-type. The first transistor TR1 may include the gate G1 of FIG. 18, the first graphene layer GP1 of FIG. 18, the first electrode E1 of FIG. 18, a portion of the third electrode E3 of FIG. 18, and the first functional layer F1 of FIG. 18. The second transistor TR2 may include the gate G1 of FIG. 18, the second graphene layer GP2 of FIG. 18, the second electrode E2 of FIG. 18, a portion of the third electrode E3 of FIG. 18, and the second functional layer F2 of FIG. 18. A power supply terminal VDD may be connected to a drain of the first transistor TR1. An output terminal VOUT may be commonly connected to a source of the first transistor TR1 and a drain of the second transistor TR2. A ground terminal VSS may be connected to a source of the second transistor TR2. An input terminal VIN may be connected to gates (common gate) of the first and second transistors TR1 and TR2. As described above, based on an input signal (voltage) applied to the common gate via the input terminal VIN, the first and second transistors TR1 and TR2 may be turned on or off and a signal output via the output terminal VOUT may be changed. Since an inverter may be used as a basic component of any of various logic devices and various electronic circuits, a graphene device having an inverter function according to an example embodiment may be used to construct various logic devices and various electronic circuits. Examples of a logic device including the inverter may include a NAND device, a NOR device, an encoder, a decoder, a multiplexer (MUX), a de-multiplexer (DEMUX), a sense amplifier, and an oscillator.

Figure 20:
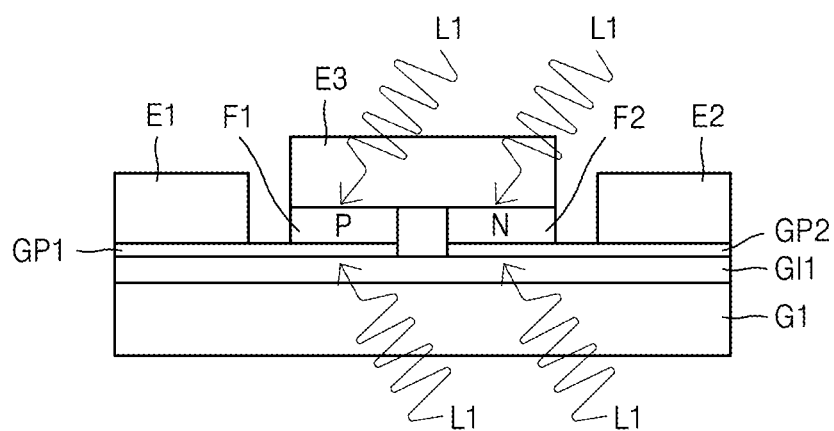
FIG. 20 is a cross-sectional view of a graphene device according to another example embodiment.

The graphene device of FIG. 18 may perform the function of a logic device (electronic device) such as the inverter of FIG. 19 and may also perform other functions. For example, the graphene device of FIG. 18 may have the function of at least one of an optoelectronic device, a memory device, and a piezoelectric device. FIG. 20 illustrates a case where the graphene device of FIG. 18 is used as an optoelectronic device. In FIG. 20, at least one of the gate G1 and the third electrode E3 may be formed of or include a transparent material. The first and second electrodes E1 and E2 may also be formed of or include a transparent material. In FIG. 20, reference numeral L1 indicates light incident upon the first and second functional layers F1 and F2.

According to other example embodiments, when the first electrode E1 and the second electrode E2 are both used as source electrodes and the third electrode E3 is used as a drain electrode in the structure of FIG. 18, the structure of FIG. 18 may be used as a single transistor. In this case, when the first functional layer F1 is a p-type semiconductor and the second functional layer F2 is an n-type semiconductor, the graphene device of FIG. 18 may be used as an ambipolar transistor. As such, when the graphene device of FIG. 18 is used as an ambipolar transistor, the first and second graphene layers GP1 and GP2 may contact each other. The first and second functional layers F1 and F2 may also contact each other.

In the embodiment described above with reference to FIG. 18, at least one of the first and second functional layers F1 and F2 may include at least one of a light emission material, a photoactive material, a resistance change material, a phase change material, a ferroelectric material, a multiferroic material, multistable molecules, and a piezoelectric material. At least one of the first and second functional layers F1 and F2 may include at least one of a Group III and V elements-containing compound, TMO, a chalcogenide material, a perovskite material, a 2D material, and an organic material. Since the material and physical property of at least one of the first and second functional layers F1 and F2 may be the same as or similar to those of the functional layer F10 described above with reference to FIG. 1, a repeated description thereof will be omitted.

According to other example embodiments, the graphene device of FIG. 18 may further include at least one of a first insertion layer (not shown) between the first functional layer F1 and the first graphene layer GP1, a second insertion layer (not shown) between the first functional layer F1 and the third electrode element E3, a third insertion layer (not shown) between the second functional layer F2 and the second graphene layer GP2, and a fourth insertion layer (not shown) between the second functional layer F2 and the third electrode element E3. Since the materials and physical properties of the first through fourth insertion layers may be the same as or similar to those of the first and second insertion layer N10 and N20 described above with reference to FIG. 1, a repeated description thereof will be omitted.

Methods of manufacturing graphene devices, according to example embodiments will now be described.

Figure 21A:
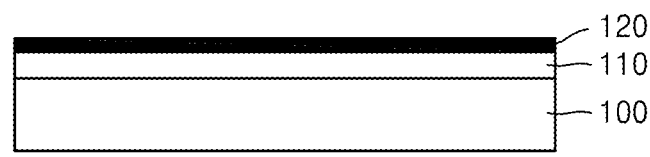
FIGS. 21A-21C are cross-sectional views for explaining a method of manufacturing a graphene device, according to an example embodiment.
Figure 21B:
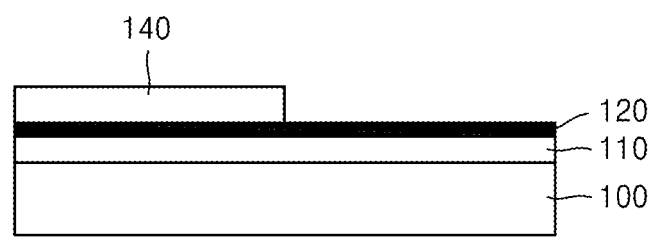
Figure 21C:
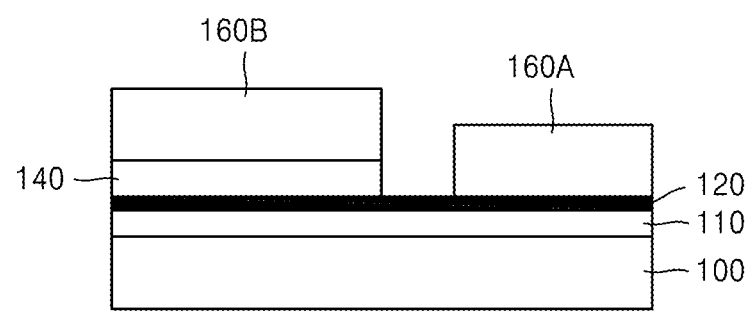

FIGS. 21A through 21C are cross-sectional views for explaining a method of manufacturing a graphene device, according to an example embodiment.

Referring to FIG. 21A, a gate insulation layer 110 may be on a gate 100, and a graphene layer 120 may be on the gate insulation layer 110. The gate insulation layer 110 may be formed by deposition, and the graphene layer 120 may be formed by transfer. Alternatively, when a metal (catalyst metal) such as Cu, Ni, Fe, Co, Pt, or Ru is used to form the gate 100, the gate insulation layer 110 may be formed by growing h-BN on the gate 100, and the graphene layer 120 may be formed by directly growing graphene on the gate insulation layer 110 formed of or include h-BN. Methods of forming the gate insulation layer 110 and the graphene layer 120 may vary.

Referring to FIG. 21B, a functional layer 140 may be on a portion of the graphene layer 120. The functional layer 140 may be formed by physical vapor deposition (PVD), such as sputtering or evaporation, or by chemical vapor deposition (CVD), atomic layer deposition (ALD), or pulsed laser deposition (PLD). Alternatively, the functional layer 140 may be on another substrate (not shown) by deposition/growth, and then may be transferred onto the graphene layer 120. The functional layer 140 may have the same material and physical property as those of the functional layer F10 of FIG. 1.

Referring to FIG. 21C, a first electrode 160A and a second electrode 160B may be on the graphene layer 120 and the functional layer 140, respectively. The first electrode 160A may be on a portion of the graphene layer 120 that is spaced apart from the functional layer 140, and the second electrode 160B may be on the functional layer 140. For example, after a conductive layer is on the graphene layer 120 and the functional layer 140, it may be patterned to form the first electrode 160A and the second electrode 160B. Alternatively, the first electrode 160A and the second electrode 160B may be formed using a lift-off process. The first electrode 160A and the second electrode 160B may be formed according to various other methods. The structure of FIG. 21C may correspond to the structures of FIGS. 5 and 9.

Figure 22:
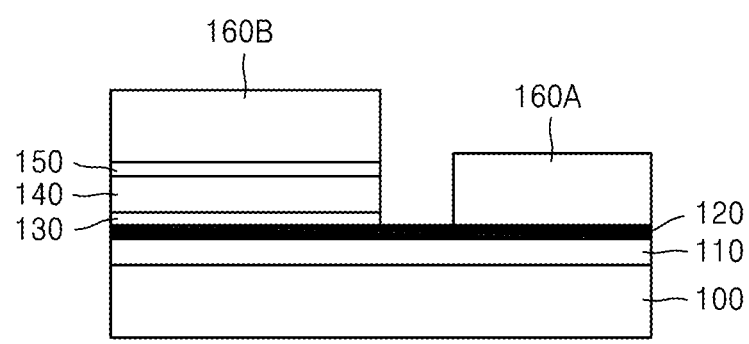
FIG. 22 is a cross-sectional view for explaining a method of manufacturing a graphene device, according to another example embodiment.

When the method of FIGS. 21A-21C is modified, the structure of FIG. 1 may be obtained. For example, as illustrated in FIG. 22, a first insertion layer 130 may be between the graphene layer 120 and the functional layer 140, and a second insertion layer 150 may be between the functional layer 140 and the second electrode 160B. The materials and roles of the first and second insertion layers 130 and 150 may be the same as or similar to those of the first and second insertion layers N10 and N20 of FIG. 1. At least one of the first and second insertion layers 130 and 150 may not be formed.

In FIGS. 21C and 22, the gate 100 and the second electrode 160B may be formed of or include transparent materials. The first electrode 160A may also be formed of or include a transparent material. Accordingly, access of light to the functional layer 140 or emission (extraction) of light from the functional layer 140 may be easily performed, and the graphene device may be used as an optical device. Examples of the transparent materials (transparent electrode material) may include graphene and indium tin oxide (ITO).

FIGS. 23A through 23D are cross-sectional views for explaining a method of manufacturing a graphene device, according to another example embodiment.

Figure 23A:
FIGS. 23A-23D are cross-sectional views for explaining a method of manufacturing a graphene device, according to another example embodiment.

Referring to FIG. 23A, a gate insulation layer 111 and a graphene layer 121 may be sequentially located on a gate 101. This may be the same as or similar to what described above with reference to FIG. 21A.

Figure 23B:
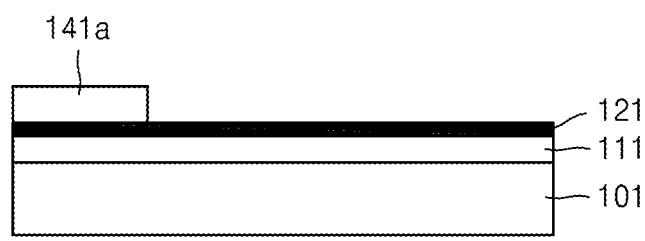

Referring to FIG. 23B, a first functional layer 141a may be on a portion of the graphene layer 121. The first functional layer 141a may be an n-type semiconductor (or a p-type semiconductor). The first functional layer 141a may have at least one of optoelectronic conversion characteristics, nonvolatile memory characteristics, and piezoelectric characteristics.

Figure 23C:
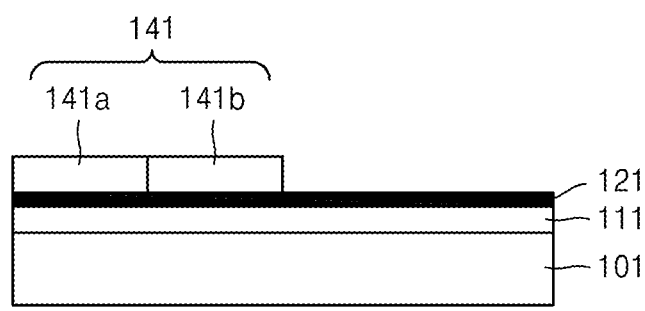

Referring to FIG. 23C, a second functional layer 141b may be on a portion of the graphene layer 121. The second functional layer 141b may be disposed beside the first functional layer 141a. The second functional layer 141b may contact a lateral surface of the first functional layer 141a. Accordingly, the first and second functional layers 141a and 141b may be laterally arranged. The second functional layer 141b may be a p-type semiconductor (or an n-type semiconductor). The second functional layer 141b may have at least one of optoelectronic conversion characteristics, nonvolatile memory characteristics, and piezoelectric characteristics. When the first functional layer 141a has one characteristic from among optoelectronic conversion characteristics, nonvolatile memory characteristics, and piezoelectric characteristics, the second functional layer 141b may have another characteristic from among optoelectronic conversion characteristics, nonvolatile memory characteristics, and piezoelectric characteristics. The first functional layer 141a and the second functional layer 141b of FIG. 23C may correspond to the first layer f1 and the second layer f2 of FIG. 11, respectively, or may correspond to the first functional layer F17a and the second functional layer F17b of FIG. 16, respectively. The first functional layer 141a and the second functional layer 141b may be considered together as a single functional layer 141.

Figure 23D:
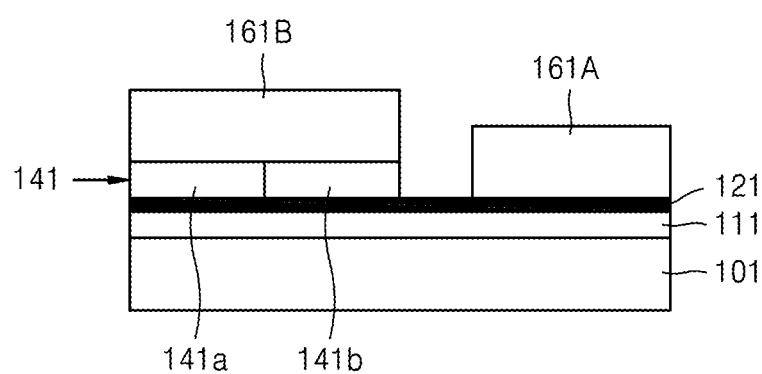

Referring to FIG. 23D, a first electrode 161A and a second electrode 161B may be on the graphene layer 121 and the functional layer 141, respectively. This may be the same as or similar to the formation of the first electrode 160A and the second electrode 160B of FIG. 22C.

FIGS. 24A through 24E are cross-sectional views for explaining a method of manufacturing a graphene device, according to another example embodiment.

Figure 24A:
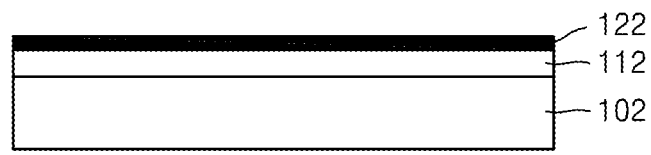
FIGS. 24A-24E are cross-sectional views for explaining a method of manufacturing a graphene device, according to another example embodiment.

Referring to FIG. 24A, a gate insulation layer 112 and a graphene layer 122 may be sequentially on a gate 102. This may be the same as or similar to what described above with reference to FIG. 21A.

Figure 24B:
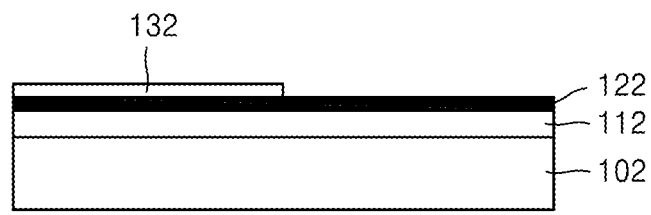

Referring to FIG. 24B, a first insertion layer 132 may be on a portion of the graphene layer 122.

Figure 24C:
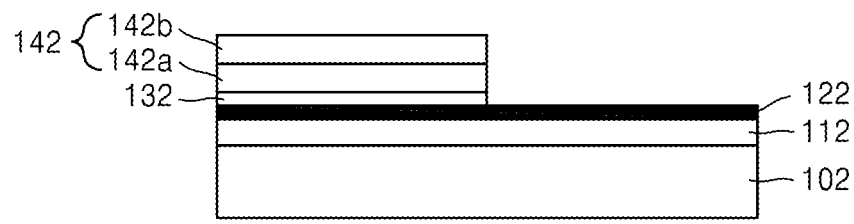

Referring to FIG. 24C, a first functional layer 142a may be on the first insertion layer 132. A second functional layer 142b may be on the first functional layer 142a. One of the first and second functional layers 142a and 142b may be a p-type semiconductor, and the other may be an n-type semiconductor. Accordingly the first and second functional layers 142a and 142b may form a p/n structure or an n/p structure. The first functional layer 142a may have one characteristic from among optoelectronic conversion characteristics, nonvolatile memory characteristics, and piezoelectric characteristics, and the second functional layer 142b may have another characteristic from among optoelectronic conversion characteristics, nonvolatile memory characteristics, and piezoelectric characteristics. The first functional layer 142a and the second functional layer 141b of FIG. 24C may correspond to the first layer f1 and the second layer f2 of FIG. 13, respectively, or may correspond to the first functional layer F18a and the second functional layer F18b of FIG. 17, respectively. The first functional layer 142a and the second functional layer 141b may be considered together as a single functional layer 142.

Figure 24D:
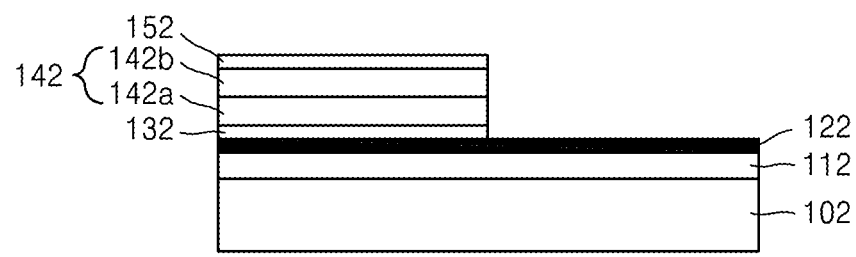

Referring to FIG. 24D, a second insertion layer 152 may be on the functional layer 142. The second insertion layer 152 may correspond to the second insertion layer N26 or N28 of FIG. 13 or 17.

Figure 24E:
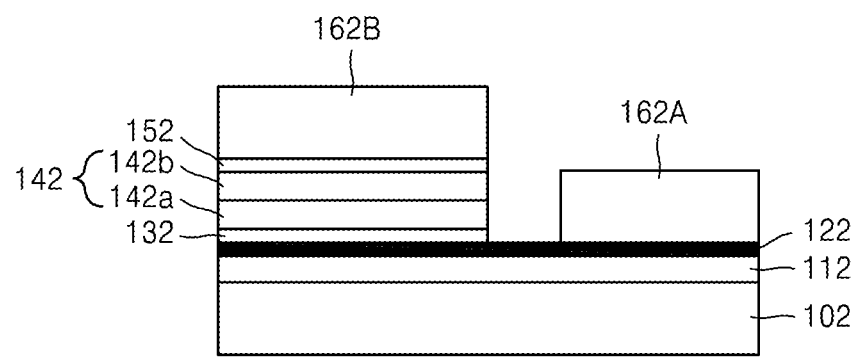

Referring to FIG. 24E, a first electrode 162A and a second electrode 162B may be on the graphene layer 122 and the second insertion layer 152, respectively. This may be the same as or similar to the formation of the first electrode 160A and the second electrode 160B of FIG. 21C.

FIGS. 25A through 25E are cross-sectional views for explaining a method of manufacturing a graphene device, according to another example embodiment.

Figure 25A:
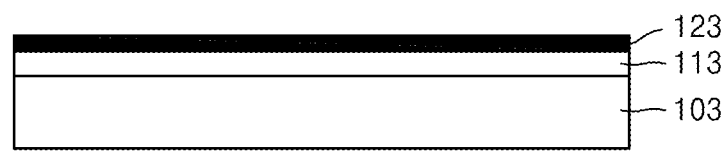
FIGS. 25A-25E are cross-sectional views for explaining a method of manufacturing a graphene device, according to another example embodiment.

Referring to FIG. 25A, a gate insulation layer 113 and a graphene layer 123 may be sequentially located on a gate 103. This gate/gate insulating layer structure may be the same as or similar to the gate/gate insulating layer structure described above with reference to FIG. 21A.

Figure 25B:
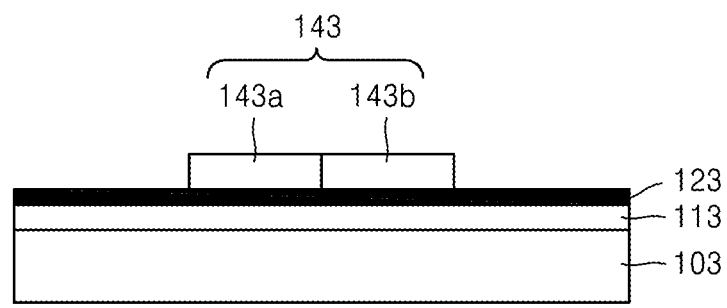

Referring to FIG. 25B, a functional layer 143 including a first functional layer 143a and a second functional layer 143b may be on the graphene layer 123. The first functional layer 143a may be a p-type semiconductor, and the second functional layer 143b may be an n-type semiconductor. Alternatively, the first functional layer 143a may be an n-type semiconductor, and the second functional layer 143b may be a p-type semiconductor. Alternatively, at least one of the first and second functional layers 143a and 143b may be an ambipolar semiconductor. At least one of the first and second functional layers 143a and 143b may have at least one of optoelectronic conversion characteristics, nonvolatile memory characteristics, and piezoelectric characteristics.

Figure 25C:
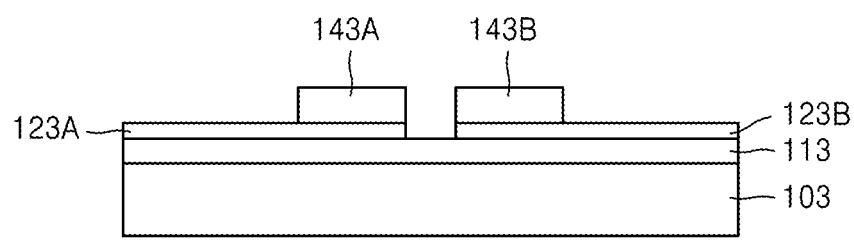

Referring to FIG. 25C, the functional layer 143 and the graphene layer 123 may be patterned. Accordingly, first and second graphene layers 123A and 123B that are spaced apart from each other may be formed from the graphene layer 123. First and second functional layers 143A and 143B that are spaced apart from each other may be formed from the functional layer 143. The first and second functional layers 143A and 143B may contact the first and second graphene layers 123A and 123B, respectively.

Figure 25D:
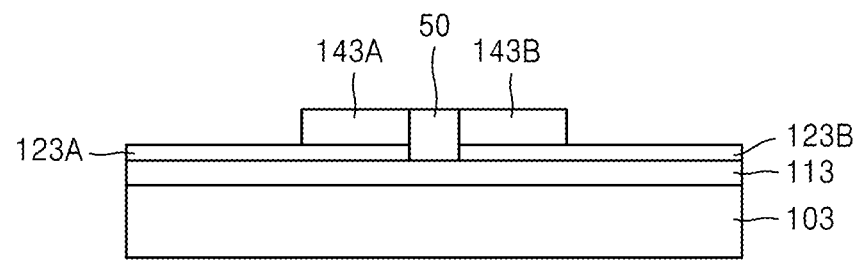

Referring to FIG. 25D, an insulator 50 may be between the first and second graphene layers 123A and 123B and between the first and second functional layers 143A and 143B. The insulator 50 may be formed of or include a material that is the same as or similar to the material used to form the insulation layer IL1 of FIG. 18. For example, the insulator 50 may be formed of or include a 2D material such as h-BN. However, the material used to form the insulator 50 is not limited to h-BN, and various materials may be used to form the insulator 50.

Figure 25E:
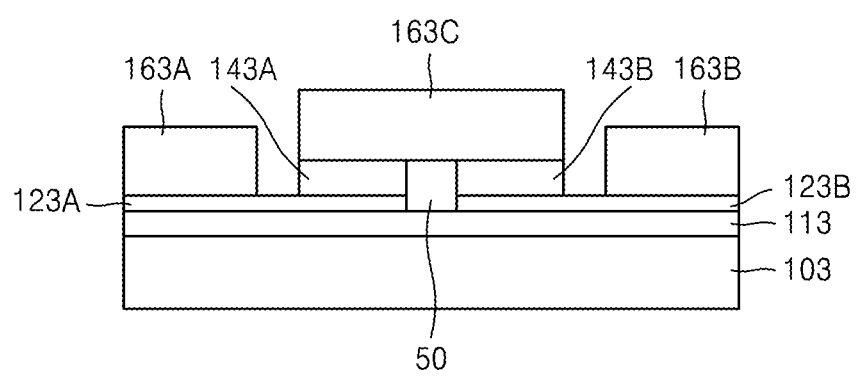

Referring to FIG. 25E, a plurality of electrodes 163A, 163B, and 163C may be on the first and second graphene layers 123A and 123B and the first and second functional layers 143A and 143B. This may be the same as or similar to the formation of the first electrode 160A and the second electrode 160B of FIG. 21C. The plurality of electrode 163A, 163B, and 163C may be a first electrode 163A in contact with the first graphene layer 123A, a second electrode 163B in contact with the second graphene layer 123B, and a third electrode 163C on the first and second functional layers 143A and 143B. The first functional layer 143A may be between the first graphene layer 123A and the third electrode 163C, and the second functional layer 143B may be between the second graphene layer 123B and the third electrode 163C. The structure of FIG. 25E may correspond to the structures of FIGS. 18 and 20. Accordingly, the structure of FIG. 25E may have the function of a complementary inverter or an ambipolar transistor.

FIGS. 26A through 26D are cross-sectional views for explaining a method of manufacturing a graphene device, according to another example embodiment.

Figure 26A:
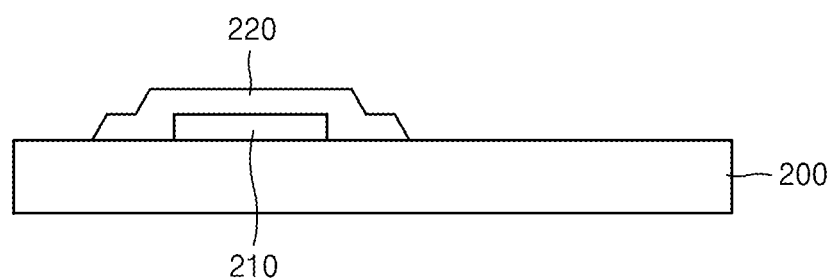
FIGS. 26A-26D are cross-sectional views for explaining a method of manufacturing a graphene device, according to another example embodiment.

Referring to FIG. 26A, a second electrode 210 may be on a portion of a substrate 200. Then, a functional layer 220 covering the second electrode 210 may be on the substrate 200.

Figure 26B:
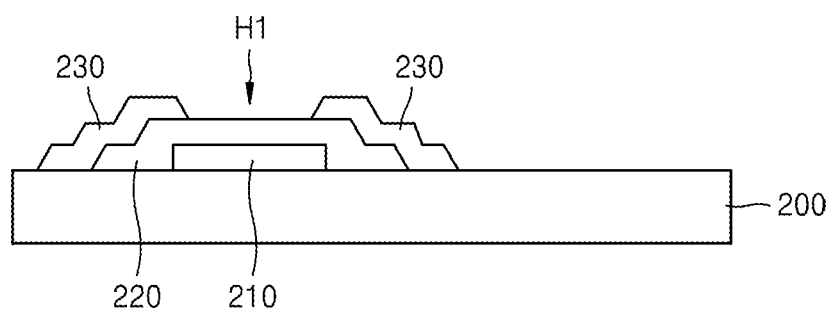

Referring to FIG. 26B, an insulation layer 230 having an aperture H1 via which a portion (e.g., a center portion) of the functional layer 220 is exposed may be on the functional layer 220. The aperture H1 may be located over the second electrode 210.

Figure 26C:
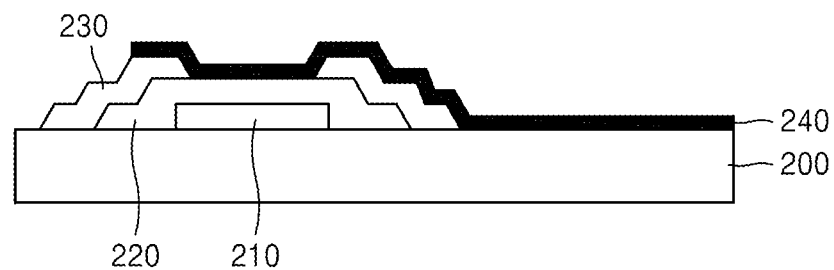

Referring to FIG. 26C, a graphene layer 240 may be on the insulation layer 230 and a portion of the substrate 200 that is around the insulation layer 230. The graphene layer 240 may contact the portion of the functional layer 220 that is exposed via the aperture H1 of FIG. 26B.

Figure 26D:
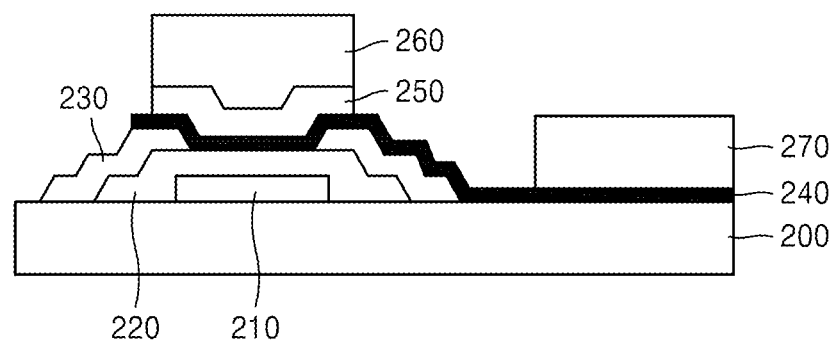

Referring to FIG. 26D, a gate insulation layer 250 and a gate 260 may be on the graphene layer 240 on the functional layer 220. A first electrode 270 spaced apart from the gate 260 may be on the graphene layer 240.

Although not illustrated, a first insertion layer may be further located between the functional layer 220 and the graphene layer 240, and a second insertion layer may be further located between the functional layer 220 and the second electrode 210. The materials and roles of the first and second insertion layers may be the same as or similar to those of the first and second insertion layers N10 and N20 of FIG. 1, respectively. At least one of the first and second insertion layers may not be formed.

Methods of operating graphene devices, according to example embodiments will now be described.

Figure 27:
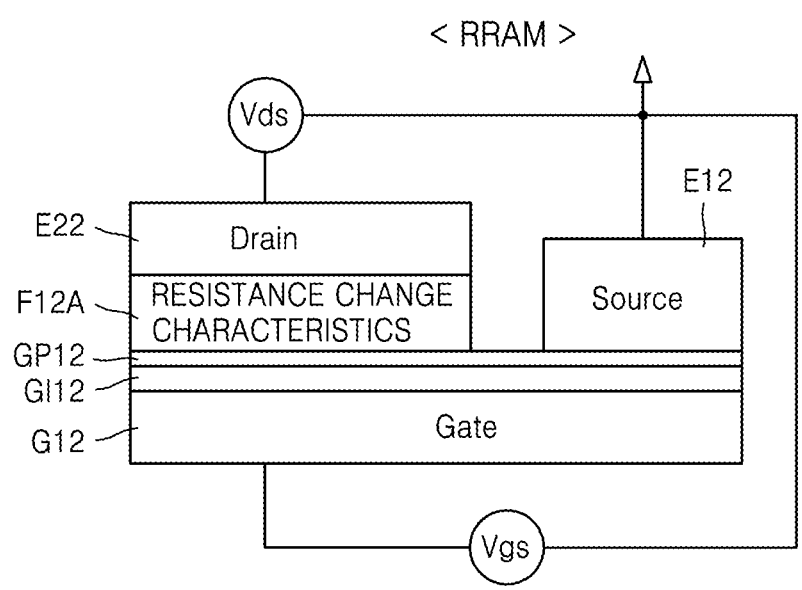
FIG. 27 is a cross-sectional view for explaining voltages Vds and Vgs applied between electrodes when a graphene device according to an example embodiment operates.

FIG. 27 is a cross-sectional view for explaining voltages Vds and Vgs applied between electrodes when a graphene device according to an example embodiment operates. The graphene device according to the present embodiment has the structure of FIG. 5 and may be a transistor having the function of RRAM.

Referring to FIG. 27, a first voltage Vds may be applied between the first electrode E12 and the second electrode E22, and a second voltage Vgs may be applied between the first electrode E12 and the gate G12. In this case, the first electrode E12 may be a source electrode and the second electrode E22 may be a drain electrode. By controlling the signs and intensities of the first voltage Vds and the second voltage Vgs, the graphene device may be turned on or off and may perform a memory operation. The first voltage Vds may be considered as a drain voltage, and the second voltage Vgs may be considered as a gate voltage. In this case, a functional layer F12A may be a resistance change layer.

Figure 28:
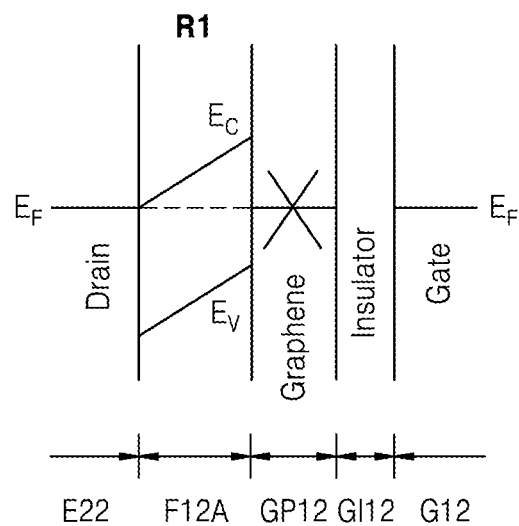
FIGS. 28-32 are energy band diagrams for explaining a method of operating the graphene device of FIG. 27.

FIG. 28 is an energy band diagram when the graphene device of FIG. 27 is in an equilibrium state. The equilibrium state may be a state where no voltage is applied between the first and second electrodes E12 and E22 and the gate G12. In the equilibrium state, as illustrated in FIG. 28, Fermi energy levels EF of the first and second electrodes E12 and E22 and the gate G12 are identical with one another. In FIG. 28, reference characters EV and EC indicate a valence band maximum energy level and a conduction band minimum energy level, respectively. These indications also apply to FIGS. 29-32. In FIG. 28, the functional layer F12A has a first resistance value. The state of FIG. 28 may correspond to a first resistance state R1.

Figure 29:
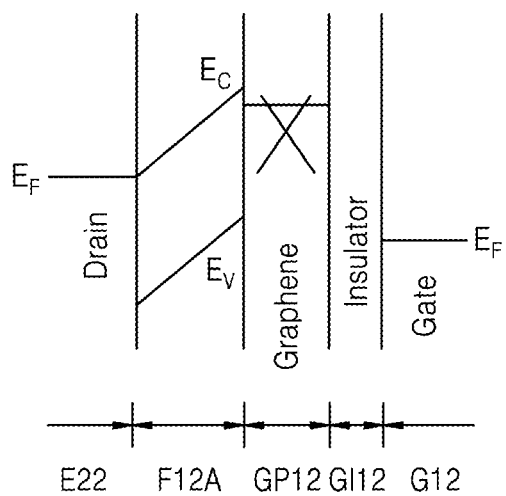

FIG. 29 is an energy diagram for explaining the principle of turning on the graphene device of FIG. 27. When a positive voltage is applied to the gate G12, that is, when a positive voltage is applied as the second voltage Vgs in FIG. 27, an energy barrier between the functional layer F12A and the graphene layer GP12 may lower, and accordingly, a current may flow between the first electrode (source electrode) E12 and the second electrode (drain electrode) E22. This may correspond to a turn-on operation of the graphene device acting as a transistor. According to a voltage applied to the gate G12, the height of the energy barrier between the functional layer F12A and the graphene layer GP12 may be controlled, and the transistor may be turned on or off.

Figure 30:
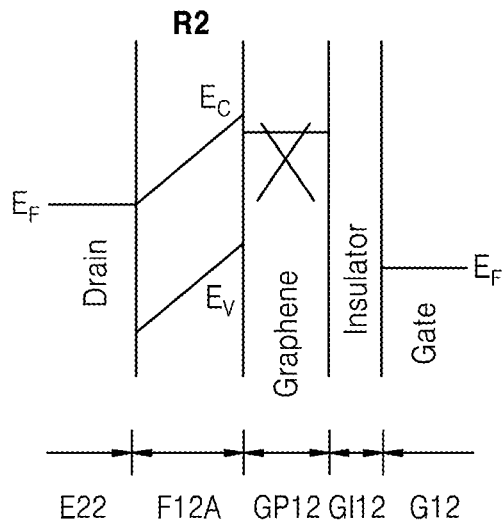
Figure 31:
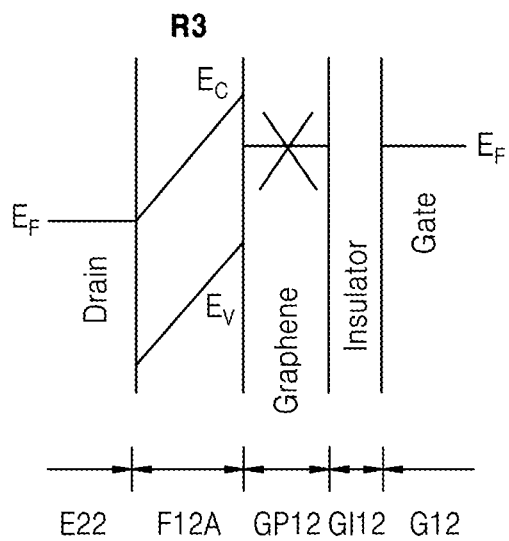
Figure 32:
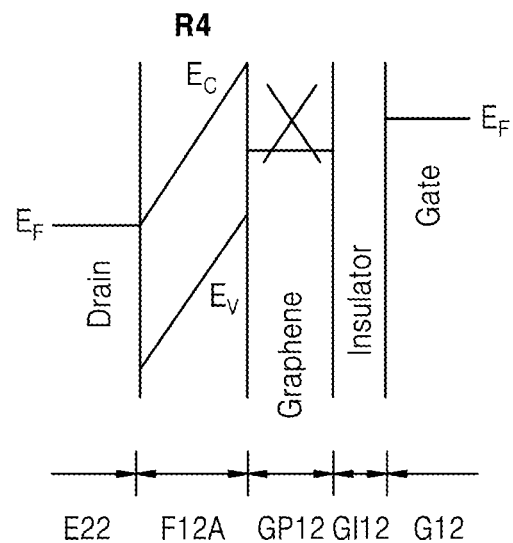

FIGS. 30-32 are energy band diagrams for illustrating a method of changing the resistance state (memory state) of the graphene device of FIG. 27 by using a gate voltage.

Referring to FIG. 30, when a positive voltage is applied to the gate G12, that is, when a positive voltage is applied as the second voltage Vgs, with a desired, or alternatively predetermined voltage (set voltage) applied between the first and second electrodes E12 and E22, the functional layer F12A may have a second resistance value. The state of FIG. 30 may correspond to a second resistance state R2.

Referring to FIG. 31, when no voltage is applied to the gate G12, that is, when a voltage of 0V is applied as the second voltage Vgs, with a desired, or alternatively predetermined voltage (set voltage) applied between the first and second electrodes E12 and E22, the inclination of an energy band of the functional layer F12A may increase, and accordingly, the functional layer F12A may have a third resistance value. The state of FIG. 31 may correspond to a third resistance state R3.

Referring to FIG. 32, when a negative voltage is applied to the gate G12, that is, when a negative voltage is applied as the second voltage Vgs, with a desired, or alternatively predetermined voltage (set voltage) applied between the first and second electrodes E12 and E22, the inclination of the energy band of the functional layer F12A may further increase, and the functional layer F12A may have a fourth resistance value. The state of FIG. 32 may correspond to a fourth resistance state R4.

As described above with reference to FIGS. 30-32, the resistance state of the functional layer F12A may vary by controlling the voltage that is to be applied to the gate G12. In other words, by controlling the voltage that is to be applied to the gate G12, the intensity of an electric field that is applied between both ends of the functional layer F12A may be controlled, and thus the resistance value of the functional layer F12A may be changed. When the electric field has a relatively small intensity (in FIG. 30), small-sized conducting filaments or a small number of conducting filaments are generated in the functional layer F12A, and thus the functional layer F12A may have a relatively high resistance value. On the other hand, when the electric field has a relatively large intensity (in FIG. 32), large-sized conducting filaments or a large number of conducting filaments are generated in the functional layer F12A, and thus the functional layer F12A may have a relatively low resistance value. Accordingly, when the resistance state of FIG. 28 is R1 and the resistance states of FIGS. 30-32 are respectively R2, R3, and R4, the resistance values thereof may have a relationship of "R1>R2>R3>R4". As such, the magnitude of the electric field applied between the graphene layer GP12 and the second electrode E22 may vary depending on the magnitude of a voltage applied to the gate G12, and thus the number of filaments or the sizes thereof generated in an RRAM memory layer (i.e., the functional layer F12A) may be controlled. Therefore, multi-state or multi-level memory devices may be realized.

FIGS. 30-32 are related with the case where a set voltage is applied between the first electrode E12 and the second electrode E22, namely, between a source electrode and a drain electrode. In FIGS. 30-32, a reset voltage having an opposite polarity to the polarity of the set voltage may be applied.

Figure 33:
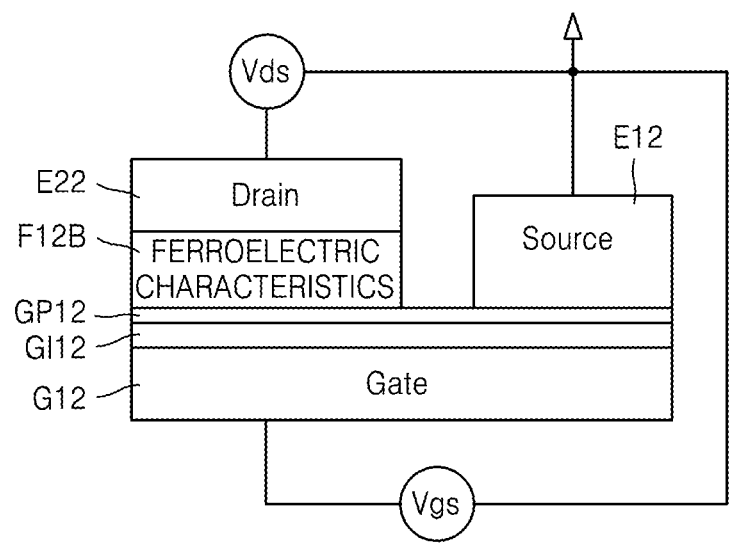
FIG. 33 is a cross-sectional view for explaining voltages Vds and Vgs applied between electrodes when a graphene device according to another example embodiment operates.

FIG. 33 is a cross-sectional view for explaining voltages Vds and Vgs applied between electrodes when a graphene device according to another example embodiment operates.

The graphene device according to the present embodiment has the structure of FIG. 5 and may be a transistor having the function of FRAM.

Referring to FIG. 33, a first voltage Vds may be applied between the first electrode E12 and the second electrode E22, and a second voltage Vgs may be applied between the first electrode E12 and the gate G12. In this case, the first electrode E12 may be a source electrode and the second electrode E22 may be a drain electrode. By controlling the signs and magnitudes of the first voltage Vds and the second voltage Vgs, turning on or off and a memory operation of the graphene device may be performed. The first voltage Vds may be considered as a drain voltage, and the second voltage Vgs may be considered as a gate voltage. In this case, a functional layer F12B may be a ferroelectric memory layer.

Figure 34:
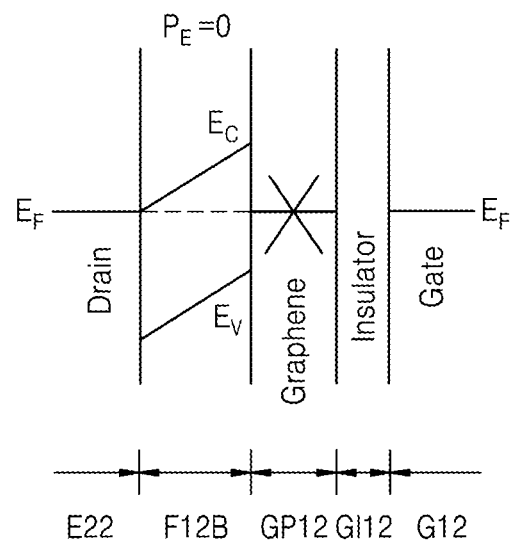
FIGS. 34-37 are energy band diagrams for explaining a method of operating the graphene device of FIG. 33.

FIG. 34 is an energy band diagram when the graphene device of FIG. 33 is in an equilibrium state. The equilibrium state may be a state where no voltage is applied between the first and second electrodes E12 and E22 and the gate G12. In FIG. 34, electrical polarization PE of the functional layer F12B may be 0.

Figure 35:
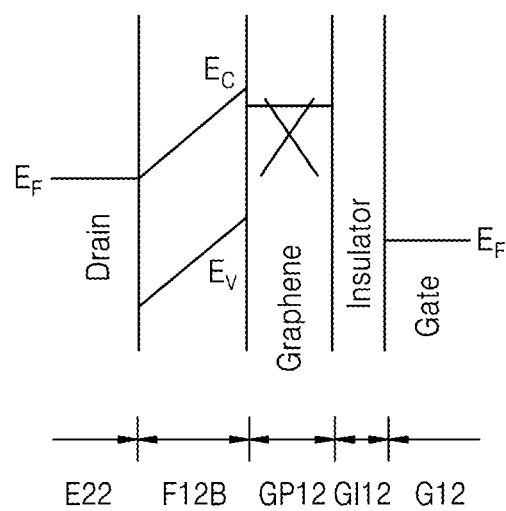

FIG. 35 is an energy band diagram for explaining the principle of turning on the graphene device of FIG. 33. When a positive voltage is applied to the gate G12, that is, when a positive voltage is applied as the second voltage Vgs in FIG. 33, an energy barrier between the functional layer F12B and the graphene layer GP12 may lower, and at the same time a current may flow between the first electrode (source electrode) E12 and the second electrode (drain electrode) E22. This may correspond to a turn-on operation of the graphene device acting as a transistor. According to a voltage that is applied to the gate G12, the height of the energy barrier between the functional layer F12B and the graphene layer GP12 may be controlled, and the transistor may be turned on or off.

Figure 36:
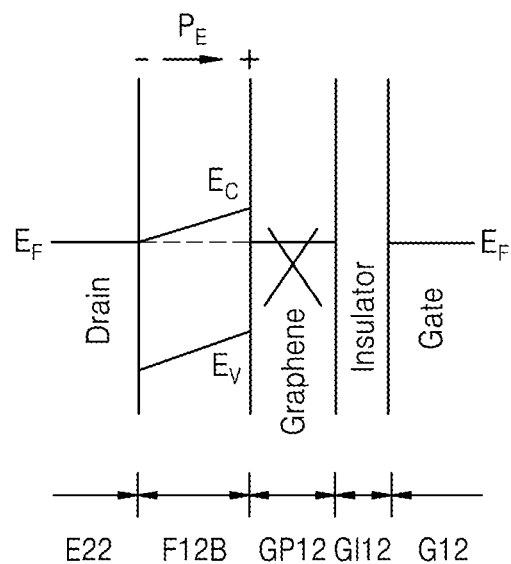
Figure 37:
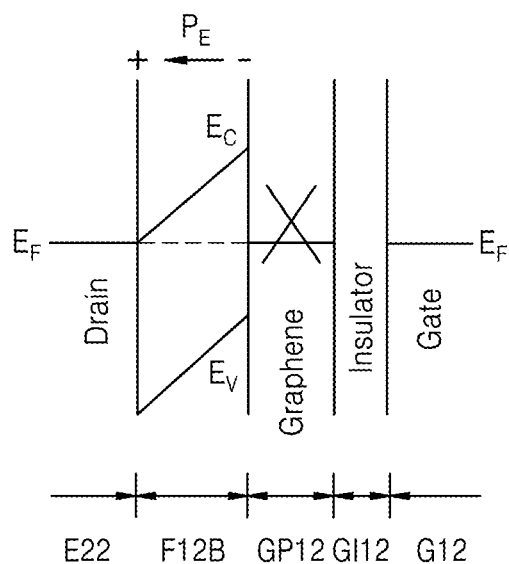

FIGS. 36 and 37 are energy band diagrams illustrating a case in which the functional layer F12B of the graphene device of FIG. 33 has first polarization and second polarization.

Referring to FIG. 36, by applying a first voltage between the first electrode E12 and the second electrode E22, a first electric field may be applied between the graphene layer GP12 and the second electrode E22, and consequently an electrical dipole may be in the functional layer F12B. In this case, the functional layer F12B may have a negative polarity near the second electrode E22 and may have a positive polarity near the graphene layer GP12. In this case, the functional layer F12B may be considered to have the first polarization.

Referring to FIG. 37, by applying a second voltage between the first electrode E12 and the second electrode E22, a second electric field may be applied between the graphene layer GP12 and the second electrode E22, and consequently an electrical dipole may be in the functional layer F12B. The direction of the second voltage may be opposite to the direction of the first voltage, and the direction of the second electric field may also be opposite to the direction of the first electric field. In this case, the functional layer F12B may have a positive polarity near the second electrode E22 and may have a negative polarity near the graphene layer GP12. In this case, the functional layer F12B may be considered to have the second polarization.

As illustrated in FIGS. 36 and 37, the height of the energy barrier between the functional layer F12B and the graphene layer GP12 may be changed by the dipole in the functional layer F12B. Consequently, a threshold voltage of the graphene device (a threshold voltage of a transistor) may be changed. According to this principle, the graphene device may be used as a memory device. In this case, since a voltage used may be lower than a voltage used in general flash memory, the FRAM according to the present embodiment may be driven with low power.

Figure 38:
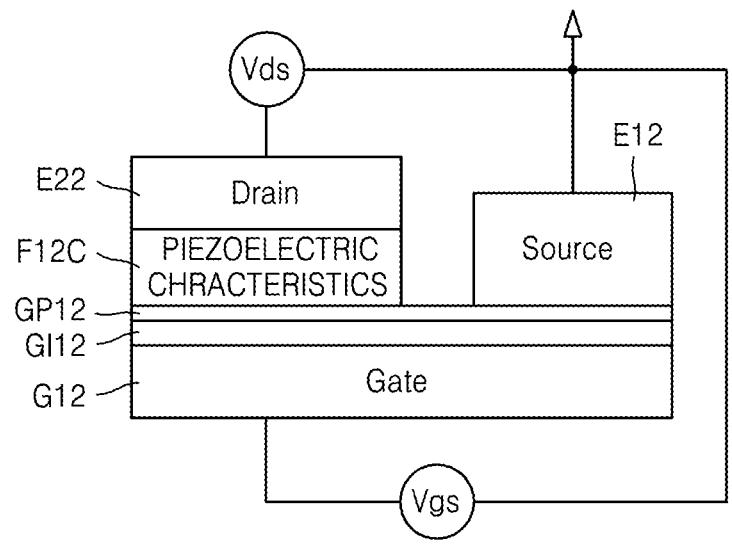
FIG. 38 is a cross-sectional view for explaining voltages Vds and Vgs applied between electrodes when a graphene device according to another example embodiment operates.

FIG. 38 is a cross-sectional view for explaining voltages Vds and Vgs applied between electrodes when a graphene device according to another example embodiment operates. The graphene device according to the present embodiment has the structure of FIG. 5 and may be a transistor having the function of a piezoelectric device.

Referring to FIG. 38, a first voltage Vds may be applied between the first electrode E12 and the second electrode E22, and a second voltage Vgs may be applied between the first electrode E12 and the gate G12. In this case, the first electrode E12 may be a source electrode and the second electrode E22 may be a drain electrode. By controlling the signs and intensities of the first voltage Vds and the second voltage Vgs, turning on/off and a memory operation of the graphene device may be performed. The first voltage Vds may be considered as a drain voltage, and the second voltage Vgs may be considered as a gate voltage. In this case, a functional layer F12C may be a piezoelectric material layer.

Figure 39:
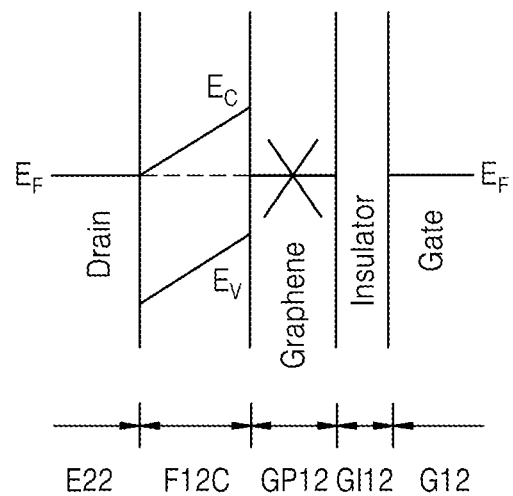
FIGS. 39-41 are energy band diagrams for explaining a method of operating the graphene device of FIG. 38.

FIG. 39 is an energy band diagram when the graphene device of FIG. 38 is in an equilibrium state. The equilibrium state may be a state where no voltage is applied between the first and second electrodes E12 and E22 and the gate G12.

Figure 40:
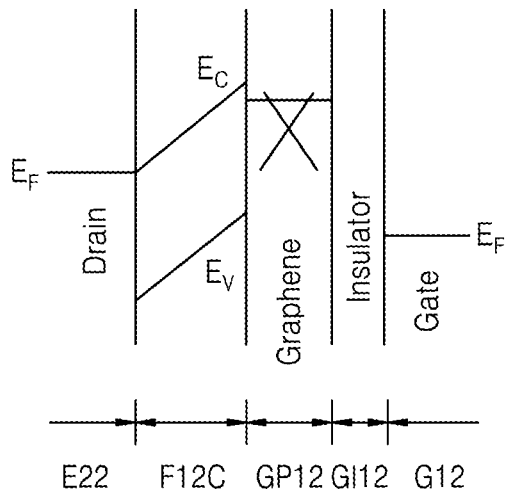

FIG. 40 is an energy band diagram for explaining the principle of turning on the graphene device of FIG. 38. When a positive voltage is applied to the gate G12, that is, when a positive voltage is applied as the second voltage Vgs in FIG. 38, an energy barrier between the functional layer F12C and the graphene layer GP12 may lower, and at the same time a current may flow between the first electrode (source electrode) E12 and the second electrode (drain electrode) E22. This may correspond to a turn-on operation of the graphene device acting as a transistor. According to a voltage applied to the gate G12, the height of the energy barrier between the functional layer F12C and the graphene layer GP12 may be controlled, and the transistor may be turned on or off.

Figure 41:
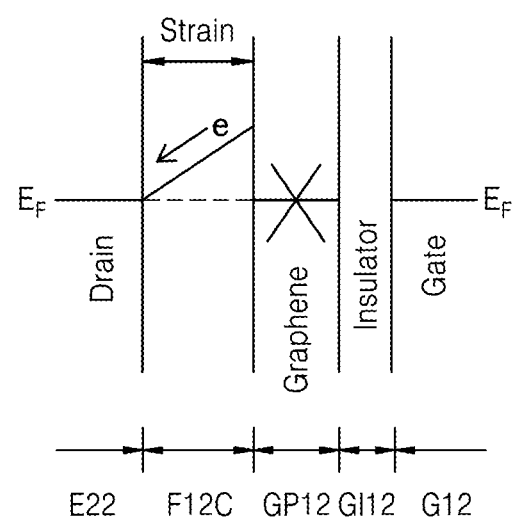

FIG. 41 is an energy band diagram illustrating the principle that electrical energy is generated by the piezoelectric characteristics of the functional layer F12C in the graphene device of FIG. 38.

Referring to FIG. 41, when the functional layer F12C is mechanically deformed, that is, when the functional layer F12C is compressed or expanded, electrical energy may be generated in the functional layer F12C by the piezoelectric characteristics of the functional layer F12C. In other words, a voltage/current may be generated in the functional layer F12C. According to this principle, an energy harvester that harvests electrical energy or a piezoelectric sensor may be realized. In this case, the characteristics of a piezoelectric device may be controlled according to a voltage applied to the gate G12. Therefore, according to an example embodiment, a piezoelectric device whose characteristics are easily controlled may be realized.

Figure 42:
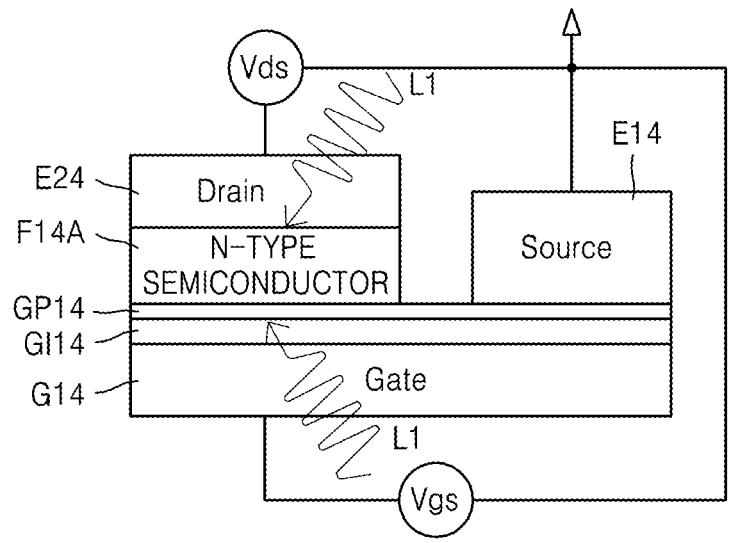
FIG. 42 is a cross-sectional view for explaining voltages Vds and Vgs applied between electrodes when a graphene device according to another example embodiment operates.

FIG. 42 is a cross-sectional view for explaining voltages Vds and Vgs applied between electrodes when a graphene device according to another example embodiment operates. The graphene device according to the example embodiment has the structure of FIG. 9 and may be a transistor having the function of a photodetector/phototransistor/photovoltaic device.

Referring to FIG. 42, a first voltage Vds may be applied between the first electrode E14 and the second electrode E24, and a second voltage Vgs may be applied between the first electrode E14 and the gate G14. In this case, the first electrode E14 may be a source electrode and the second electrode E24 may be a drain electrode. The first voltage Vds may be considered as a drain voltage, and the second voltage Vgs may be considered as a gate voltage. In this case, a functional layer F14A may be an n-type semiconductor layer or a photoactive layer.

Figure 43:
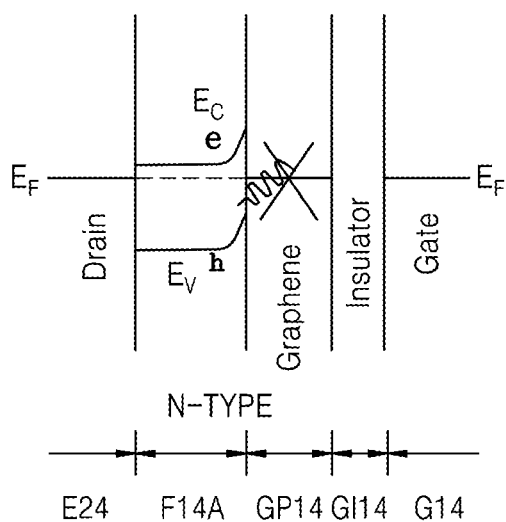
FIGS. 43 and 44 are energy band diagrams for explaining a method of operating the graphene device of FIG. 42.

FIG. 43 is an energy band diagram when the graphene device of FIG. 42 is in an equilibrium state, and is for explaining the principle that a current is generated by light.

Referring to FIG. 43, when light is radiated to the functional layer F14A, an electron (e) and a hole (h) may be generated in the functional layer F14A and separated into the second electrode E24 and the graphene layer GP14, and thus a current may flow (in the case of photodetectors/phototransistors). Alternatively, due to the generation of the electron (e) and the hole (h), a potential difference may be generated between both ends of the functional layer F14A (in the case of photovoltaic devices).

Figure 44:
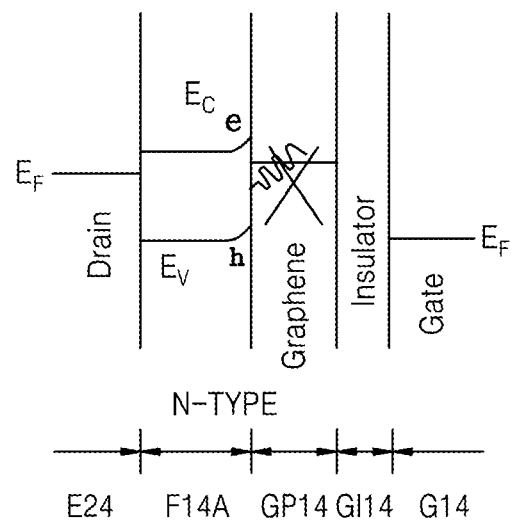

FIG. 44 is an energy band diagram when a voltage has been applied to the gate G14 of the graphene device of FIG. 42.

Referring to FIG. 44, when a desired, or alternatively predetermined voltage is applied to the gate G14, an energy barrier between the functional layer F14A and the graphene layer GP14 may decrease. When the functional layer F14A is an n-type semiconductor, the voltage applied to the gate G14 may be a positive voltage. In this case, built-in potential generated by the functional layer F14A may decrease. Although not illustrated, when a negative voltage is applied to the gate G14, the built-in potential may increase, and the energy barrier between the functional layer F14A and the graphene layer GP14 may increase. According to the voltage applied to the gate G14, the efficiency of separation between the electron (e) and the hole (h) generated by light may be controlled.

Figure 45:
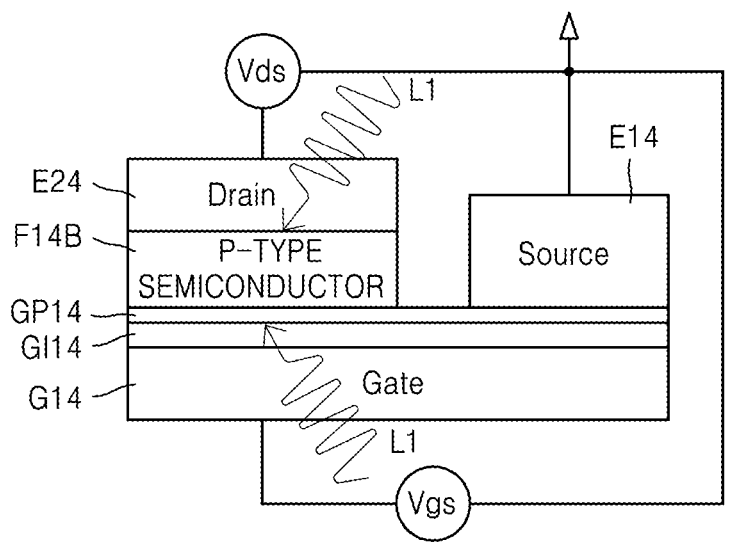
FIG. 45 is a cross-sectional view for explaining voltages Vds and Vgs applied between electrodes when a graphene device according to another example embodiment operates.

FIG. 45 illustrates a case where a functional layer F14B is a p-type semiconductor layer in the graphene device of FIG. 42. The graphene device may have the function of a photodetector/phototransistor/photovoltaic device.

Figure 46:
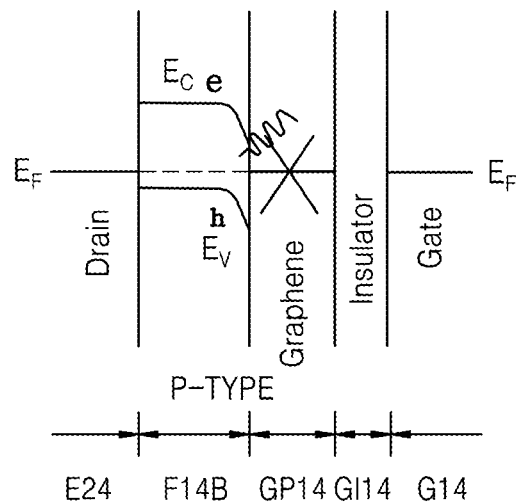
FIGS. 46 and 47 are energy band diagrams for explaining a method of operating the graphene device of FIG. 45.

FIG. 46 is an energy band diagram when the graphene device of FIG. 45 is in an equilibrium state, and is for explaining the principle that a current is generated by light.

Referring to FIG. 46, when light is radiated to the functional layer F14B as a p-type semiconductor layer, an electron (e) and a hole (h) may be generated in the functional layer F14B and separated into the second electrode E24 and the graphene layer GP14, and thus a current may flow (in the case of photodetectors/phototransistors). Alternatively, due to the generation of the electron (e) and the hole (h), a potential difference may be generated between both ends of the functional layer F14B (in the case of photovoltaic devices).

Figure 47:
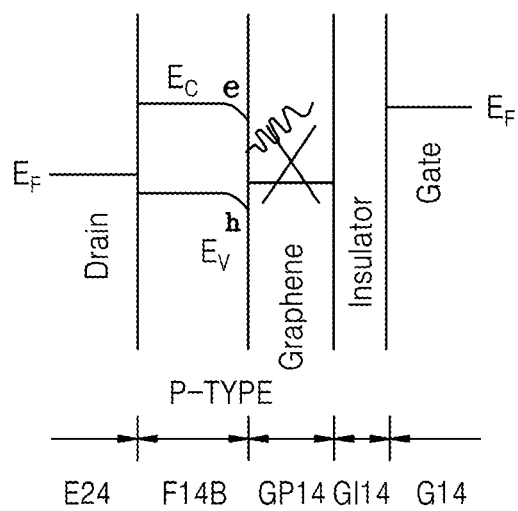

FIG. 47 is an energy band diagram when a voltage has been applied to the gate G14 of the graphene device of FIG. 45.

Referring to FIG. 47, when a desired, or alternatively predetermined voltage is applied to the gate G14, an energy barrier between the functional layer F14B and the graphene layer GP14 may decrease. When the functional layer F14B is a p-type semiconductor, the voltage applied to the gate G14 may be a negative voltage. In this case, built-in potential generated by the functional layer F14B may decrease. Although not illustrated, when a positive voltage is applied to the gate G14, the built-in potential may increase, and the energy barrier between the functional layer F14B and the graphene layer GP14 may increase. According to the voltage applied to the gate G14, the efficiency of separation between the electron (e) and the hole (h) generated by light may be controlled.

Figure 48:
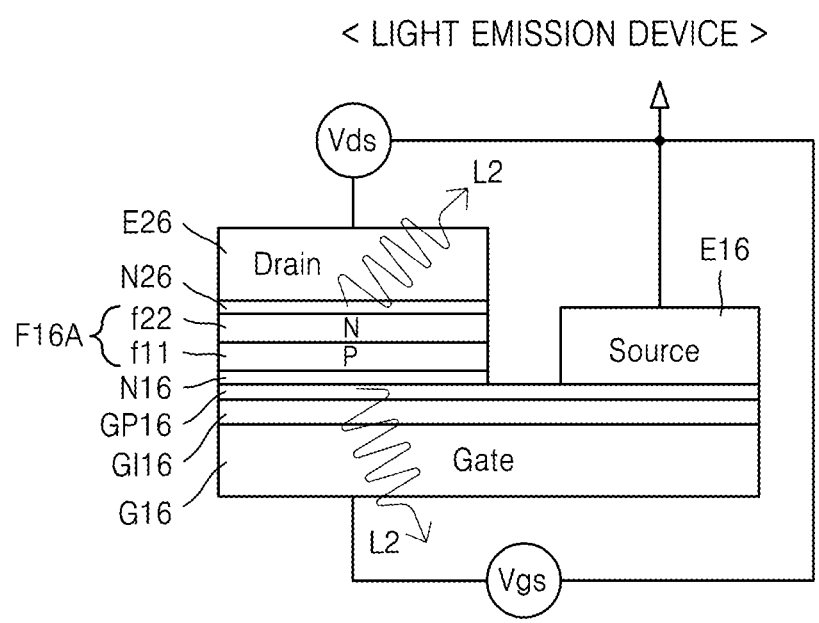
FIG. 48 is a cross-sectional view for explaining voltages Vds and Vgs applied between electrodes when a graphene device according to another example embodiment operates.

FIG. 48 is a cross-sectional view for explaining voltages Vds and Vgs applied between electrodes when a graphene device according to another example embodiment operates. The graphene device according to the present embodiment has the structure of FIG. 13 and may be a transistor having the function of a light emission device. A functional layer F16A may include a first layer f11 and a second layer f22.

Referring to FIG. 48, a first voltage Vds may be applied between the first electrode E16 and the second electrode E26, and a second voltage Vgs may be applied between the first electrode E16 and the gate G16. The application of the first and second voltages Vds and Vgs may be similar to the voltage application described above with reference to FIG. 27.

Figure 49:
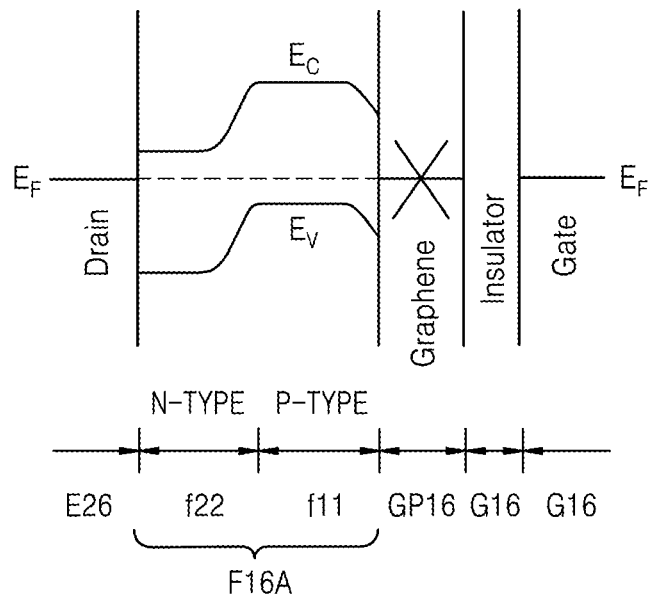
FIGS. 49 and 50 are energy band diagrams for explaining a method of operating the graphene device of FIG. 48.

FIG. 49 is an energy band diagram when the graphene device of FIG. 48 is in an equilibrium state.

Figure 50:
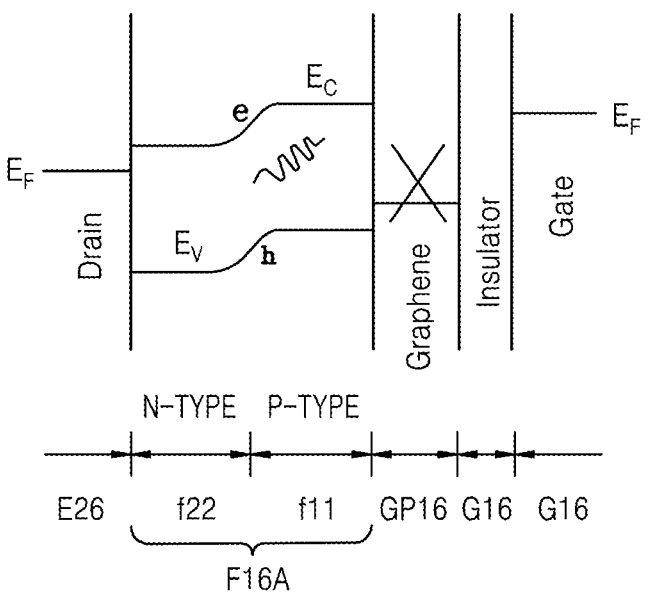

FIG. 50 is an energy band diagram illustrating the principle that light is emitted from the functional layer F16A in the graphene device of FIG. 48.

Referring to FIG. 50, when an energy barrier between the graphene layer G16 and the first layer f11 of the functional layer F16A is lowered by applying a desired, or alternatively predetermined voltage to the gate G16, and a voltage is applied between the second electrode E26 and the graphene layer GP16, namely, between the second electrode E26 and the first electrode E16, an electron (e) and a hole (h) move into the functional layer F16A and combine together. Thus, light may be emitted. In this case, the voltage applied to the gate G16 may be a negative voltage. If a voltage having an opposite sign, namely, a positive voltage, is applied to the gate G16, the energy barrier between the graphene layer GP16 and the functional layer F16A may increase, and at the same time no light may be emitted. In other words, the light emission characteristics of the graphene device of FIG. 48 may be controlled according to a voltage that is applied to the gate G16.

As described above, according to the one or more of the above example embodiments, a multifunctional graphene device may be realized. In other words, a graphene device capable of performing various functions while having excellent performance by combining a functional material layer with graphene may be obtained. For example, a graphene device having characteristics/function of at least one of a memory device, a piezoelectric device, and an optoelectronic device in the structure of a switching device/electronic device (e.g., a transistor) may be obtained. This graphene device may be applied to various electronic apparatuses/electronic circuits/logic devices.

While example embodiments have been particularly shown and described, it should be understood that the example embodiments should be considered in a descriptive sense only and not for purposes of limitation. For example, it will be understood by one of ordinary skill in the art that various changes in form and details may be made in the structures of the graphene devices of FIGS. 1-20 without departing from the spirit and scope of the following claims. It will also be understood by one of ordinary skill in the art that a functional layer (i.e., the functional layer F10 and the like) may have various characteristics (function) other than memory characteristics, piezoelectric characteristics, and optoelectronic conversion characteristics. In addition, it will be understood by one of ordinary skill in the art that various changes may be made in the graphene device manufacturing methods described with reference to FIGS. 21A-21C, FIG. 22, FIGS. 23A-23D, FIGS. 24A-24E, FIGS. 25A-25E, and FIGS. 26A-26D and the graphene device operating methods described with reference to FIGS. 27-50 without departing from the spirit and scope of the following claims. Graphene devices according to example embodiments may be applied to various semiconductor devices and electronic apparatuses for various purposes. Therefore, the scope of the example embodiments is defined not by the embodiments described herein but by the appended claims.

It should be understood that the example embodiments described therein should be considered in a descriptive sense only and not for purposes of limitation. Descriptions of features within each example embodiment should typically be considered as available for other similar features in other example embodiments.

While the example embodiments have been particularly shown and described, it will be understood by those of ordinary skill in the art that various changes in form and details may be made therein without departing from the spirit and scope of the example embodiments as defined by the following claims.

What is claimed is:

1. A graphene device comprising:
  a graphene layer;
  a first electrode electrically connected to a first region of the graphene layer;
  a second electrode in spatial correspondence to a second region of the graphene layer;
  a functional layer between the graphene layer and the second electrode and having at least one of nonvolatile memory characteristics and piezoelectric characteristics;
  a gate facing the functional layer with the graphene layer therebetween;
  a gate insulation layer between the graphene layer and the gate;
  a first insertion layer between the functional layer and the graphene layer, the first insertion layer including a different material than the functional layer and the graphene layer, the first insertion layer directly contacting the graphene layer and the functional layer; and
  a second insertion layer between the functional layer and the second electrode, the second insertion layer including a different material than the functional layer and the second electrode, the second insertion layer directly contacting the functional layer and the second electrode.

2. The graphene device of claim 1, wherein the functional layer comprises at least one of a resistance change material, a phase change material, a ferroelectric material, a multiferroic material, multistable molecules, and a piezoelectric material.

3. The graphene device of claim 1, wherein the functional layer comprises at least one of transition metal oxide (TMO), a chalcogenide material, a perovskite material, a two-dimensional (2D) material, and an organic material.

4. The graphene device of claim 1, wherein the first and second insertion layers are semiconductors or insulators.

5. The graphene device of claim 1, wherein
  the gate insulation layer is on the gate,
  the graphene layer is on the gate insulation layer,
  the first and second electrodes spaced apart from each other are on the graphene layer, and
  the functional layer is between the graphene layer and the second electrode.

6. The graphene device of claim 1, wherein
  the graphene layer is on a substrate,
  the first electrode is on the first region of the graphene layer,
  the second electrode is between the second region of the graphene layer and the substrate,
  the functional layer is between the second electrode and the graphene layer, and
  the gate insulation layer and the gate are sequentially on the graphene layer on the functional layer.

7. The graphene device of claim 6, wherein the graphene layer is between the substrate and at least one of the gate and the gate insulation layer.

8. The graphene device of claim 1, wherein the functional layer comprises an n-type semiconductor or a p-type semiconductor.

9. The graphene device of claim 1, wherein the functional layer comprises an ambipolar semiconductor.

10. The graphene device of claim 1, wherein
  the functional layer comprises a plurality of layers laterally arranged, and
  the plurality of layers comprise an n-type semiconductor layer and a p-type semiconductor layer.

11. The graphene device of claim 1, wherein
  the functional layer comprises a plurality of layers vertically stacked, and
  the plurality of layers comprise an n-type semiconductor layer and a p-type semiconductor layer.

12. The graphene device of claim 1, wherein
  the functional layer comprises a phase change material, and
  the graphene device further comprises a heating electrode between the functional layer and the second electrode.

13. The graphene device of claim 1, wherein the functional layer has optoelectronic conversion characteristics.

14. The graphene device of claim 1, wherein
  a second functional layer is further between the graphene layer and the second electrode, and
  the second functional layer has optoelectronic conversion characteristics.

15. The graphene device of claim 1, wherein at least one of the gate, the first electrode, and the second electrode includes a transparent material.

16. The graphene device of claim 1, wherein the graphene device is a multifunctional device.

17. A graphene device comprising:
  first and second graphene layers;
  first and second electrode elements electrically connected to the first and second graphene layers, respectively;
  a third electrode element in spatial correspondence to a portion of the first graphene layer and a portion of the second graphene layer;
  a first functional layer between the third electrode element and the first graphene layer;
  a second functional layer between the third electrode element and the second graphene layer;
  a gate spaced apart from the first and second graphene layers;
  a gate insulation layer between the gate and the first and second graphene layers; and
  an insulation layer between the first functional layer and the second functional layer,
  wherein at least one of the first and second functional layers has at least one of optoelectronic conversion characteristics, nonvolatile memory characteristics, and piezoelectric characteristics.

18. The graphene device of claim 17, wherein
one of the first and second functional layers is an n-type semiconductor, and
the other is a p-type semiconductor.

19. The graphene device of claim 18, wherein the graphene device has a complementary inverter structure.

20. The graphene device of claim 17, wherein the graphene device has an ambipolar transistor structure.

21. The graphene device of claim 17, wherein at least one of the first and second functional layers comprises at least one of a light emission material, a photoactive material, a resistance change material, a phase change material, a ferroelectric material, a multiferroic material, multistable molecules, and a piezoelectric material.

22. The graphene device of claim 17, wherein at least one of the first and second functional layers comprises at least one of a Group DI and V elements-containing compound, TMO, a chalcogenide material, a perovskite material, a 2D material, and an organic material.

23. The graphene device of claim 17, further comprising at least one of:
a first insertion layer between the first functional layer and the first graphene layer;
a second insertion layer between the first functional layer and the third electrode element;
a third insertion layer between the second functional layer and the second graphene layer; and
a fourth insertion layer between the second functional layer and the third electrode element.

24. A graphene device comprising:
at least one graphene layer;
at least one electrode element electrically connected to the at least one graphene layer;
at least one functional layer between the at least one electrode element and the at least one graphene layer;
wherein:
the at least one functional layer is at least one of an optoelectronic conversion layer, a nonvolatile memory layer, a piezoelectric layer, an n-type semiconductor and a p-type semiconductor;
the at least one graphene layer includes first and second graphene layers;
the at least one electrode includes first and second electrode elements electrically connected to the first and second graphene layers and a third electrode element in spatial correspondence to a portion of the first graphene layer and a portion of the second graphene layer;
the at least one functional layer includes a first and second functional layers between the third electrode element and the first and second graphene layers, respectively; and
an insulation layer between the first functional layer and the second functional layer.

25. The graphene device of claim 24, further comprising:
a gate opposite the at least one functional layer with respect to the at least one graphene layer; and
a gate insulating layer between the at least one graphene layer and the gate.

26. A graphene device comprising:
at least one graphene layer;
at least one electrode element electrically connected to the at least one graphene layer;
at least one functional layer between the at least one electrode element and the at least one graphene layer; and
at least one insertion layer between the at least one graphene layer and the at least one electrode element;
wherein:
the at least one functional layer is at least one of an optoelectronic conversion layer, a nonvolatile memory layer, a piezoelectric layer, an n-type semiconductor and a p-type semiconductor;
the at least one graphene layer includes a single graphene layer;
the at least one electrode element includes first and second electrodes electrically connected to a first region and a second region of the graphene layer, respectively; and
the at least one functional layer includes a plurality of layers one of laterally arranged and stacked in a direction perpendicular to a surface of the graphene layer between the graphene layer and the second electrode, and at least two of the plurality of layers include different materials from each other;
wherein the at least one insertion layer includes first and second insertion layers,
wherein the first insertion layer is in direct contact with the at least one graphene layer and the first electrode, and
wherein the second insertion layer is in direct contact with the at least one graphene layer and the at least one functional layer.

27. The graphene device of claim 26,
wherein the second insertion layer includes a different material than the at least one functional layer and the at least one graphene layer.

28. The graphene device of claim 26, wherein the at least one graphene layer is between a substrate and at least one of a gate and a gate insulation layer.

\* \* \* \* \*